(12) United States Patent
Lee et al.

(10) Patent No.: US 11,641,092 B2
(45) Date of Patent: *May 2, 2023

(54) HIGH-POWER LASER PACKAGING UTILIZING CARBON NANOTUBES BETWEEN METALLIC BONDING MATERIALS

(71) Applicant: TERADIODE, INC., Wilmington, MA (US)

(72) Inventors: Won Tae Lee, Highlands Ranch, CO (US); Michael Deutsch, Derry, NH (US); Zhongyong Liu, Dracut, MA (US)

(73) Assignee: Panasonic Connect North America, Division of Panasonic Corporation of North America, Newark, NJ (US)

( * ) Notice: Subject to any disclaimer, the term of this patent is extended or adjusted under 35 U.S.C. 154(b) by 165 days.

This patent is subject to a terminal disclaimer.

(21) Appl. No.: 17/173,337

(22) Filed: Feb. 11, 2021

(65) Prior Publication Data

US 2021/0257810 A1    Aug. 19, 2021

Related U.S. Application Data

(63) Continuation of application No. 15/686,413, filed on Aug. 25, 2017, now Pat. No. 10,951,006.

(60) Provisional application No. 62/381,089, filed on Aug. 30, 2016.

(51) Int. Cl.
| | | |
|---|---|---|
| *G02B 5/18* | (2006.01) | |
| *G02B 7/18* | (2021.01) | |
| *G02B 27/44* | (2006.01) | |
| *H01S 5/0237* | (2021.01) | |
| *H01S 5/024* | (2006.01) | |
| *H01S 5/40* | (2006.01) | |
| *H01S 5/14* | (2006.01) | |

(Continued)

(52) U.S. Cl.
CPC ........ *H01S 5/02476* (2013.01); *G02B 5/1814* (2013.01); *G02B 7/1815* (2013.01); *G02B 27/44* (2013.01); *H01S 5/0237* (2021.01); *H01S 5/4062* (2013.01); *H01S 5/4075* (2013.01); *H01S 5/4081* (2013.01); *H01S 5/0236* (2021.01); *H01S 5/02345* (2021.01); *H01S 5/143* (2013.01); *H01S 5/4087* (2013.01)

(58) Field of Classification Search
CPC .... G02B 5/1814; G02B 7/1815; G02B 27/44; G11B 7/1353; H01S 5/022–0239; H01S 5/02476; H01S 5/0425; H01S 5/143; H01S 5/4062; H01S 5/4075; H01S 5/4081; H01S 5/4087
USPC ................................... 359/566, 569
See application file for complete search history.

(56) References Cited

U.S. PATENT DOCUMENTS

| | | | |
|---|---|---|---|
| 10,951,006 B2 * | 3/2021 | Lee | H01S 5/4081 |
| 2002/0054422 A1 | 5/2002 | Carr et al. | |
| 2005/0089638 A1 | 4/2005 | Chopra | |

(Continued)

OTHER PUBLICATIONS

International Search Report, for International Application No. PCT/US2017/048576, dated Dec. 11, 2017, 23 pages.

*Primary Examiner* — Ryan S Dunning
(74) *Attorney, Agent, or Firm* — Morgan, Lewis & Bockius LLP

(57) ABSTRACT

In various embodiments, laser devices include a thermal bonding layer featuring an array of carbon nanotubes and at least one metallic thermal bonding material.

20 Claims, 9 Drawing Sheets

(51) Int. Cl.
  *H01S 5/0236* (2021.01)
  *H01S 5/02345* (2021.01)

(56) References Cited

U.S. PATENT DOCUMENTS

| | | |
|---|---|---|
| 2008/0181277 A1 | 7/2008 | Konig et al. |
| 2009/0068387 A1 | 3/2009 | Panzer et al. |
| 2010/0110556 A1 | 5/2010 | Chann et al. |
| 2011/0051758 A1 | 3/2011 | Krejci et al. |
| 2012/0276327 A1 | 1/2012 | Cola et al. |
| 2012/0321961 A1 | 12/2012 | Yushin et al. |
| 2013/0299843 A1 | 11/2013 | Motoda |
| 2017/0117683 A1 | 4/2017 | Junghans et al. |
| 2018/0062348 A1 | 3/2018 | Lee et al. |
| 2018/0080629 A1 | 3/2018 | Inoue et al. |
| 2019/0067161 A1 | 2/2019 | Kaifuchi |

\* cited by examiner

HIGH-POWER LASER PACKAGING UTILIZING CARBON NANOTUBES BETWEEN METALLIC BONDING MATERIALS

RELATED APPLICATION

This application is a continuation of U.S. patent application Ser. No. 15/686,413, filed Aug. 25, 2017, which claims the benefit of and priority to U.S. Provisional Patent Application No. 62/381,089, filed Aug. 30, 2016, the entire disclosure of which is hereby incorporated herein by reference.

TECHNICAL FIELD

In various embodiments, the present invention relates to high-power laser systems packaged utilizing carbon nanotubes.

BACKGROUND

High-power laser systems are utilized for a host of different applications, such as welding, cutting, drilling, and materials processing. Such laser systems typically include a laser emitter, the laser light from which is coupled into an optical fiber (or simply a "fiber"), and an optical system that focuses the laser light from the fiber onto the workpiece to be processed. Wavelength beam combining (WBC) is a technique for scaling the output power and brightness from laser diodes, laser diode bars, stacks of diode bars, or other lasers arranged in a one- or two-dimensional array. WBC methods have been developed to combine beams along one or both dimensions of an array of emitters. Typical WBC systems include a plurality of emitters, such as one or more diode bars, that are combined using a dispersive element to form a multi-wavelength beam. Each emitter in the WBC system individually resonates, and is stabilized through wavelength-specific feedback from a common partially reflecting output coupler that is filtered by the dispersive element along a beam-combining dimension. Exemplary WBC systems are detailed in U.S. Pat. No. 6,192,062, filed on Feb. 4, 2000, U.S. Pat. No. 6,208,679, filed on Sep. 8, 1998, U.S. Pat. No. 8,670,180, filed on Aug. 25, 2011, and U.S. Pat. No. 8,559,107, filed on Mar. 7, 2011, the entire disclosure of each of which is incorporated by reference herein.

While techniques such as WBC have succeeded in producing laser-based systems for a wide variety of applications, wider adoption of such systems has resulted in the demand for ever-higher levels of laser output power. Typically higher laser powers involve the driving of laser diodes at increasingly higher currents, which results in higher operating temperatures and concomitant thermal-management issues aimed at preventing temperature-based reliability issues. High-power lasers typically feature the use of a laser emitter with one or more heat sinks or other thermal-management structures for heat dissipation, and these structures are often coupled to the emitter via a solder or other soft, malleable compound that maintains thermal contact between the emitter and heat sink even in the event of relative movement between the components resulting from thermal cycling.

While such solder-based solutions mitigate some of the reliability issues resulting from thermal cycling during high-power laser operation, the use of solder may also introduce other reliability issues such as solder creep. Moreover, many conventional solders may lack the thermal conductivity needed to adequately conduct heat away from high-power laser devices being operated at high current levels. Therefore, there is a need for packaging schemes for high-power laser devices (e.g., laser diodes and/or diode bars) that are compatible with existing heat sinks and other mounting hardware and that also provide improved heat conductions from the laser devices.

SUMMARY

In accordance with embodiments of the present invention, laser beam emitters are attached to one or more heat sinks or other thermal-management structures via a thermal bonding material that includes, consists essentially of, or consists of a composite of one or more metals and an array of carbon nanotubes. The composite may be layered, e.g., the metal may be disposed in one, two, or more layers with layers of arrayed carbon nanotubes therebetween. In other embodiments, the composite may be a mixture in which one or more metals form a matrix in which the array of carbon nanotubes is embedded. Still other embodiments are layered structures, as described above, in which one or more of the layers are a mixture of one or more metals and an array of carbon nanotubes. Carbon nanotubes, which may be single-walled or multi-walled, have a thermal conductivity of 2000-6000 $W \cdot m^{-1} \cdot K^{-1}$, which is superior to that of diamond. In embodiments of the present invention, the carbon nanotubes are combined with the metal(s), e.g., on the top or bottom surfaces of the nanotube array to facilitate thermal (and in various embodiments, electrical) contact between the emitter and the highly thermally conductive carbon nanotubes. For example, the metal(s) may include, consist essentially of, or consist of indium (In), tin (Sn), gold (Au), AuSn, and/or InSn, and or mixtures or compounds including one or more of these metals with or without one or more other metals. The metal may be flowable and/or deformable at room temperature to facilitate contact between the emitter and the less flexible and more brittle carbon nanotubes. The metal/nanotube composite may be utilized to supplement or replace conventional soldering materials between the emitter and the heat sink or other thermal-management structure.

Laser devices in accordance with embodiments of the present invention may be utilized in WBC systems to form high brightness, low beam parameter product (BPP) laser systems. The BPP is the product of the laser beam's divergence angle (half-angle) and the radius of the beam at its narrowest point (i.e., the beam waist, the minimum spot size). The BPP quantifies the quality of the laser beam and how well it can be focused to a small spot, and is typically expressed in units of millimeter-milliradians (mm-mrad). A Gaussian beam has the lowest possible BPP, given by the wavelength of the laser light divided by pi. The ratio of the BPP of an actual beam to that of an ideal Gaussian beam at the same wavelength is denoted $M^2$, or the "beam quality factor," which is a wavelength-independent measure of beam quality, with the "best" quality corresponding to the "lowest" beam quality factor of 1.

Thermal bonding materials in accordance with embodiments of the present invention may be "sealed" in place in a laser packaging structure in order to prevent creep or other movement of the thermal bonding material, as described in U.S. patent application Ser. No. 15/006,733, filed on Jan. 26, 2016, the entire disclosure of which is incorporated by reference herein. For example, thermal bonding layers and materials between various components of a laser device (e.g., the beam emitter itself and/or heat-sinking components such as electrode mounts and housings) may be sealed with a material (e.g., one or more metals) that is impervious to the propagation of the thermal bonding material therethrough; thus, creep of the thermal bonding material from between the components is substantially prevented. The sealing may be accomplished by, for example, a deposition technique such as electroplating or electroless deposition. In embodiments of the present invention in which the thermal bonding material is disposed between the beam emitter and one or more electrode mounts, the sealing may be performed before or after the beam emitter is affixed to the electrode mount(s) via the thermal bonding material. Portions of the laser device where the sealing material is not desired (e.g., portions of the beam emitter from which the beam(s) are emitted) may be protected from deposition of the sealing material via, e.g., masking or the selective application of an inhibitor material that prevents deposition thereon. In other embodiments, such portions of the laser device may initially be coated with the sealing material, and the sealing material may be later removed via, e.g., etching and/or machining.

Embodiments of the present invention utilize carbon-nanotube-based thermal bonding materials has relatively rigid structures embedded within an otherwise softer, more flowable thermal bonding layer (e.g., one based on one or more metals such as In, Sn, Au, or alloys or mixtures thereof or with one or more other metals). For example, portions of a composite thermal bonding material featuring an array of carbon nanotubes as detailed herein may be dispersed (e.g., in a random pattern or in a regular pattern such as a "mesh" of interlocking lines or a pattern of isolated columns) within a matrix of softer thermal bonding material that does not include carbon nanotubes. In such embodiments, the dispersed phase including the carbon nanotubes may act to suppress or substantially prevent creep or other movement of the other phase (i.e., the portion not including carbon nanotubes). Embodiments of the invention may instead, or in addition, utilize structures and techniques disclosed in U.S. patent application Ser. No. 15/006,693, filed on Jan. 26, 2016, the entire disclosure of which is incorporated by reference herein.

In accordance with embodiments of the present invention, laser devices may also be thermally managed via a package that incorporates highly thermally and electrically conductive electrodes for driving the beam emitter, as well as a thermally conductive mount (that may be liquid cooled) that is electrically isolated from the electrodes. Specifically, the electrodes may include, consist essentially of, or consist of copper and be electrically connected to the anode and cathode of the beam emitter. The mount may include, consist essentially of, or consist of, e.g., aluminum, and may incorporate an electrically insulating layer between the mount and the electrode facing the mount. For example, the electrically insulating layer may include, consist essentially of, or consist of aluminum oxide and/or aluminum nitride layers that provide thermal conductivity therethrough but retard or substantially prevent electrical conduction therethrough. Aluminum nitride advantageously has a high thermal conductivity but a low electrical conductivity. As utilized herein, materials with a high thermal conductivity, or "thermally conductive materials," have a thermal conductivity of at least 100 watts per meter per Kelvin ($W \cdot m^{-1} \cdot K^{-1}$), at least 170 $W \cdot m^{-1} \cdot K^{-1}$, or even at least 300 $W \cdot m^{-1} \cdot K^{-1}$. As utilized herein, materials with a high electrical conductivity, or "electrically conductive materials," have an electrical conductivity, e.g., at 20° C., of at least $1 \times 10^5$ siemens per meter (S/m), at least $1 \times 10^6$ S/m, or even at least $1 \times 10^7$ S/m. As utilized herein, materials with a high electrical resistivity, or "electrically insulating materials," have an electrical resistivity of at least $1 \times 10^8$ ohm-meter ($\Omega \cdot m$), at least $1 \times 10^{10}$ $\Omega \cdot m$, or even at least $1 \times 10^{12}$ $\Omega \cdot m$.

Laser devices in accordance with embodiments of the present invention may be utilized in WBC systems to form high brightness, low beam parameter product (BPP) laser systems. The BPP is the product of the laser beam's divergence angle (half-angle) and the radius of the beam at its narrowest point (i.e., the beam waist, the minimum spot size). The BPP quantifies the quality of the laser beam and how well it can be focused to a small spot, and is typically expressed in units of millimeter-milliradians (mm-mrad). A Gaussian beam has the lowest possible BPP, given by the wavelength of the laser light divided by pi. The ratio of the BPP of an actual beam to that of an ideal Gaussian beam at the same wavelength is denoted $M^2$, or the "beam quality factor," which is a wavelength-independent measure of beam quality, with the "best" quality corresponding to the "lowest" beam quality factor of 1.

As known to those of skill in the art, lasers are generally defined as devices that generate visible or invisible light through stimulated emission of light. Lasers generally have properties that make them useful in a variety of applications, as mentioned above. Common laser types include semiconductor lasers, solid-state lasers, fiber lasers, and gas lasers. Semiconductor lasers (mostly laser diodes) may be electrically or optically pumped and generally efficiently generate very high output powers often at the expense of poor beam quality. Semiconductor lasers may produce low power with good spatial properties for application in, e.g., optical disc players. Yet other semiconductor lasers may be suitable for producing high pulse rate, low power pulses (e.g., for telecommunications applications). Special types of semiconductor lasers include quantum cascade lasers (for mid-infrared light) and surface-emitting semiconductor lasers (VCSELs and VECSELs), the latter also being suitable for pulse generation with high powers.

Solid-state lasers may be based on ion-doped crystals or glasses (e.g., doped insulator lasers) and may pumped with discharge lamps or laser diodes for generating high output power. Alternatively solid-state lasers may produce low power output with very high beam quality, spectral purity and/or stability (e.g. for measurement purposes). Some solid-state lasers may produce ultra-short pulses with pico-second or femtosecond durations. Common gain media for use with solid state lasers include: Nd:YAG, Nd:YVO$_4$, Nd:YLF, Nd:glass, Yb:YAG, Yb:glass, Ti:sapphire, Cr:YAG, and Cr:LiSAF.

Fiber lasers may be based on optical glass fibers which are doped with some laser-active ions in the fiber core. Fiber lasers may achieve extremely high output powers (up to kilowatts) with high beam quality. Narrow line width operation and the like may also be supported by fiber lasers. Gas lasers, which include helium-neon lasers, $CO_2$ lasers, argon ion lasers, and the like, may be based on gases which are typically excited with electrical discharges. Frequently used gases include $CO_2$, argon, krypton, and gas mixtures such as helium-neon. In addition, excimer lasers may be based on any of ArF, KrF, XeF, and $F_2$. Other less common laser types include chemical and nuclear pumped lasers, free electron lasers, and X-ray lasers.

A laser diode, such as a laser diode described in the following general description may be used in association with embodiments of the innovations described herein. A laser diode is generally based on a simple diode structure that supports the emission of photons (light). However, to improve efficiency, power, beam quality, brightness, tunability, and the like, this simple structure is generally modified to provide a variety of many practical types of laser diodes. Laser diode types include small edge-emitting varieties that generate from a few milliwatts up to roughly half a watt of output power in a beam with high beam quality. Structural types of diode lasers include double heterostructure lasers that include a layer of low bandgap material sandwiched between two high bandgap layers; quantum well lasers that include a very thin middle layer (quantum well layer) resulting in high efficiency and quantization of the laser's energy; multiple quantum well lasers that include more than one quantum well layer improve gain characteristics; quantum wire or quantum sea (dots) lasers replace the middle layer with a wire or dots that produce higher efficiency quantum well lasers; quantum cascade lasers that enable laser action at relatively long wavelengths that may be tuned by altering the thickness of the quantum layer, separate confinement heterostructure lasers, which are the most common commercial laser diode and include another two layers above and below the quantum well layer to efficiently confine the light produced; distributed feedback lasers, which are commonly used in demanding optical communication applications and include an integrated diffraction grating that facilitates generating a stable wavelength set during manufacturing by reflecting a single wavelength back to the gain region; vertical-cavity surface-emitting lasers (VCSELs), which have a different structure that other laser diodes in that light is emitted from its surface rather than from its edge; and vertical-external-cavity surface-emitting-laser (VECSELs) and external-cavity diode lasers, which are tunable lasers that use mainly double heterostructure diodes and include gratings or multiple-prism grating configurations. External-cavity diode lasers are often wavelength-tunable and exhibit a small emission line width. Laser diode types also include a variety of high power diode-based lasers including: broad area lasers that are characterized by multi-mode diodes with oblong output facets and generally have poor beam quality but generate a few watts of power, tapered lasers that are characterized by astigmatic mode diodes with tapered output facets that exhibit improved beam quality and brightness when compared to broad area lasers; ridge waveguide lasers that are characterized by elliptical mode diodes with oval output facets; and slab-coupled optical waveguide lasers (SCOWL) that are characterized by circular mode diodes with output facets and may generate watt-level output in a diffraction-limited beam with nearly a circular profile.

Laser diode arrays, bars and/or stacks, such as those described in the following general description may be used in association with embodiments of the innovations described herein. Laser diodes may be packaged individually or in groups, generally in one-dimensional rows/arrays (diode bars) or two dimensional arrays (diode-bar stacks). A diode array stack is generally a vertical stack of diode bars. Laser diode bars or arrays generally achieve substantially higher power, and cost effectiveness than an equivalent single broad area diode. High-power diode bars generally contain an array of broad-area emitters, generating tens of watts with relatively poor beam quality; despite the higher power, the brightness is often lower than that of a broad area laser diode. High-power diode bars may be stacked to produce high-power stacked diode bars for generation of extremely high powers of hundreds or thousands of watts. Laser diode arrays may be configured to emit a beam into free space or into a fiber. Fiber-coupled diode-laser arrays may be conveniently used as a pumping source for fiber lasers and fiber amplifiers.

A diode-laser bar is a type of semiconductor laser containing a one-dimensional array of broad-area emitters or alternatively containing sub arrays containing, e.g., 10-20 narrow stripe emitters. A broad-area diode bar typically contains, for example, 19-49 emitters, each having dimensions on the order of, e.g., 1 µm×100 µm. The beam quality along the 1 µm dimension or fast-axis is typically diffraction-limited. The beam quality along the 100 µm dimension or slow-axis or array dimension is typically many times diffraction-limited. Typically, a diode bar for commercial applications has a laser resonator length of the order of 1 to 4 mm, is about 10 mm wide and generates tens of watts of output power. Most diode bars operate in the wavelength region from 780 to 1070 nm, with the wavelengths of 808 nm (for pumping neodymium lasers) and 940 nm (for pumping Yb:YAG) being most prominent. The wavelength range of 915-976 nm is used for pumping erbium-doped or ytterbium-doped high-power fiber lasers and amplifiers.

A property of diode bars that is usually addressed is the output spatial beam profile. For most applications beam conditioning optics are needed. Significant efforts are therefore often required for conditioning the output of a diode bar or diode stack. Conditioning techniques include using aspherical lenses for collimating the beams while preserving the beam quality. Micro optic fast axis collimators may be used to collimate the output beam along the fast-axis. Arrays of aspherical cylindrical lenses are often used for collimation of each laser element along the array or slow-axis. To achieve beams with approximately circular beam waist, a special beam shaper for symmetrization of the beam quality of each diode bar or array can be applied. A degrading property of diode bars is the "smile"—a slight bend of the planar nature of the connected emitters. Smile errors may have detrimental effects on the ability to focus beams from diode bars. Another degrading property is collimation error of the slow- and fast-axis. For example, a twisting of the fast-axis collimation lens results in an effective smile. This has detrimental effects on the ability to focus. In stacks, "pointing" error of each bar is often the most dominant effect. Pointing error is a collimation error and is the result of the array or bar that is offset from the fast-axis lens. An offset of 1 µm is the same as the whole array having a smile of 1 µm.

Diode bars and diode arrays overcome limitations of very broad single emitters, such as amplified spontaneous emission or parasitic lasing in the transverse direction or filament formation. Diode arrays may also be operated with a more stable mode profile, because each emitter produces its own beam. Techniques which exploit some degree of coherent coupling of neighbored emitters may result in better beam quality. Such techniques may be included in the fabrication of the diode bars while others may involve external cavities. Another benefit of diode arrays is that the array geometry makes diode bars and arrays very suitable for coherent or spectral beam combining to obtain a much higher beam quality.

In addition to raw bar or array offerings, diode arrays are available in fiber-coupled form because this often makes it much easier to utilize each emitter's output and to mount the diode bars so that cooling of the diodes occurs some distance from the place where the light is used. Usually, the light is coupled into a single multimode fiber, using either a simple fast-axis collimator without beam conditioning in the slow-axis direction, or a more complex beam shaper to better preserve the brightness. It is also possible to launch the beamlets from the emitters into a fiber bundle (with one fiber per emitter). Emission bandwidth of a diode bar or diode array is an important consideration for some applications. Optical feedback (e.g. from volume Bragg grating) can significantly improve wavelength tolerance and emission bandwidth. In addition, bandwidth and exact center wavelength may also be important for spectral beam combining.

A diode stack is simply an arrangement of multiple diode bars that can deliver very high output power. Also called diode laser stack, multi-bar module, or two-dimensional laser array, the most common diode stack arrangement is that of a vertical stack which is effectively a two-dimensional array of edge emitters. Such a stack may be fabricated by attaching diode bars to thin heat sinks and stacking these assemblies so as to obtain a periodic array of diode bars and heat sinks. There are also horizontal diode stacks, and two-dimensional stacks. For high beam quality, the diode bars generally should be as close to each other as possible. On the other hand, efficient cooling requires some minimum thickness of the heat sinks mounted between the bars. This tradeoff of diode bar spacing results in beam quality of a diode stack in the vertical direction (and subsequently its brightness) much lower than that of a single diode bar. There are, however, several techniques for significantly mitigating this problem, e.g., by spatial interleaving of the outputs of different diode stacks, by polarization coupling, or by wavelength multiplexing. Various types of high-power beam shapers and related devices have been developed for such purposes. Diode stacks may provide extremely high output powers (e.g. hundreds or thousands of watts).

Embodiments of the present invention couple the one or more input laser beams into an optical fiber. In various embodiments, the optical fiber has multiple cladding layers surrounding a single core, multiple discrete core regions (or "cores") within a single cladding layer, or multiple cores surrounded by multiple cladding layers.

Herein, "optical elements" may refer to any of lenses, mirrors, prisms, gratings, and the like, which redirect, reflect, bend, or in any other manner optically manipulate electromagnetic radiation. Herein, beam emitters, emitters, or laser emitters, or lasers include any electromagnetic beam-generating device such as semiconductor elements, which generate an electromagnetic beam, but may or may not be self-resonating. These also include fiber lasers, disk lasers, non-solid state lasers, etc. Generally, each emitter includes a back reflective surface, at least one optical gain medium, and a front reflective surface. The optical gain medium increases the gain of electromagnetic radiation that is not limited to any particular portion of the electromagnetic spectrum, but that may be visible, infrared, and/or ultraviolet light. An emitter may include or consist essentially of multiple beam emitters such as a diode bar configured to emit multiple beams. The input beams received in the embodiments herein may be single-wavelength or multi-wavelength beams combined using various techniques known in the art. In addition, references to "lasers," "laser emitters," or "beam emitters" herein include not only single-diode lasers, but also diode bars, laser arrays, diode bar arrays, and single or arrays of vertical cavity surface-emitting lasers (VCSELs).

In an aspect, embodiments of the invention feature a laser apparatus that includes, consists essentially of, or consists of a beam emitter having first and second opposed surfaces, a first electrode mount disposed beneath the first surface of the beam emitter, and a thermal bonding layer disposed between the beam emitter and first electrode mount. The thermal bonding layer improves thermal conduction between the beam emitter and the first electrode mount. The thermal bonding layer includes, consists essentially of, or consists of (i) an array of carbon nanotubes, (ii) a first metallic bonding material disposed between the array of carbon nanotubes and the beam emitter, and (iii) a second metallic bonding material disposed between the array of carbon nanotubes and the first electrode mount.

Embodiments of the invention may include one or more of the following in any of a variety of combinations. The first metallic bonding material and/or the second metallic bonding material (and/or any metallic bonding material discussed herein) may include, consist essentially of, or consist of In, Sn, Au, Cu, Al, Ag, Zn, Pb, AuSn, and/or InSn. At least some (or even substantially all or all) of the carbon nanotubes within the array of carbon nanotubes may be aligned substantially perpendicular to the first surface of the beam emitter and/or to a surface of the first electrode mount (e.g., the surface facing the beam emitter). The beam emitter may include, consist essentially of, or consist of a diode bar emitting a plurality of discrete beams.

The laser apparatus may include a second electrode mount (i) disposed over and in thermal contact with the second surface of the beam emitter and (ii) electrically insulated from the first electrode mount except for any conductive path through the beam emitter. The laser apparatus may include a second thermal bonding layer disposed between the beam emitter and second electrode mount. The second thermal bonding layer may improve thermal conduction between the beam emitter and the second electrode mount. The second thermal bonding layer may include, consist essentially of, or consist of (i) a second array of carbon nanotubes, (ii) a third metallic bonding material disposed between the array of carbon nanotubes and the beam emitter, and (iii) a fourth metallic bonding material disposed between the array of carbon nanotubes and the second electrode mount. The third metallic bonding material and/or the fourth metallic bonding material may include, consist essentially of, or consist of In, Sn, Au, Cu, Al, Ag, Zn, Pb, AuSn, and/or InSn. At least some (or even substantially all or all) of the carbon nanotubes within the second array of carbon nanotubes may be aligned substantially perpendicular to the second surface of the beam emitter and/or to a surface of the second electrode mount (e.g., the surface facing the beam emitter). Any of the first, second, third, or fourth metallic bonding materials (and/or any metallic bonding material disclosed herein) may include, consist essentially of, or consist of a material different from a material of any of the others. Any of the first, second, third, or fourth metallic bonding materials (and/or any metallic bonding material disclosed herein) may include, consist essentially of, or consist of a material that is the same as a material of any of the others.

A sealing material may be disposed along a lateral surface of the thermal bonding layer. The sealing material may prevent or retard movement of the thermal bonding layer from between the beam emitter and an electrode mount. The sealing material may include, consist essentially of, or consist of one or more electrically conductive and/or thermally conductive materials. The sealing material may include, consist essentially of, or consist of copper, aluminum, nickel, and/or chromium. A top surface of the thermal bonding layer may contact the beam emitter. A bottom surface of the thermal bonding layer may contact the first electrode mount. The laser apparatus may include a third metallic bonding material disposed on and/or around at least a portion of a lateral surface of the thermal bonding layer that spans the top and bottom surfaces. The third metallic bonding material may include, consist essentially of, or consist of a material different from or the same as a material of the first and/or second metallic bonding materials. The third metallic bonding material may include, consist essentially of, or consist of In, Sn, Au, Cu, Al, Ag, Zn, Pb, AuSn, and/or InSn. The laser apparatus may include a third metallic bonding material disposed within the array of carbon nanotubes. The third metallic bonding material may surround at least some (or even all or substantially all) of the carbon nanotubes within the array. The third metallic bonding material may include, consist essentially of, or consist of a material different from or the same as a material of the first and/or second metallic bonding materials. The third metallic bonding material may include, consist essentially of, or consist of In, Sn, Au, Cu, Al, Ag, Zn, Pb, AuSn, and/or InSn.

In another aspect, embodiments of the invention feature a laser apparatus that includes, consists essentially of, or consists of a beam emitter having first and second opposed surfaces, a first electrode mount disposed beneath the first surface of the beam emitter, and a thermal bonding layer disposed between the beam emitter and first electrode mount. The thermal bonding layer improves thermal conduction between the beam emitter and the first electrode mount. The thermal bonding layer includes, consists essentially of, or consists of (i) an array of carbon nanotubes, and (ii) a first metallic bonding material disposed within the array of carbon nanotubes so as to surround at least some of the carbon nanotubes within the array.

Embodiments of the invention may include one or more of the following in any of a variety of combinations. The first metallic bonding material may include, consist essentially of, or consist of In, Sn, Au, Cu, Al, Ag, Zn, Pb, AuSn, and/or InSn. At least some (or even substantially all or all) of the carbon nanotubes within the array of carbon nanotubes may be aligned substantially perpendicular to the first surface of the beam emitter and/or to a surface of the first electrode mount (e.g., the surface facing the beam emitter). The beam emitter may include, consist essentially of, or consist of a diode bar emitting a plurality of discrete beams.

The laser apparatus may include a second metallic bonding material disposed between the thermal bonding layer and the beam emitter. The second metallic bonding material may include, consist essentially of, or consist of In, Sn, Au, Cu, Al, Ag, Zn, Pb, AuSn, and/or InSn. The second metallic bonding material may include, consist essentially of, or consist of a material different from or the same as a material of the first metallic bonding material.

The laser apparatus may include a second metallic bonding material disposed between the thermal bonding layer and the first electrode mount. The second metallic bonding material may include, consist essentially of, or consist of In, Sn, Au, Cu, Al, Ag, Zn, Pb, AuSn, and/or InSn. The second metallic bonding material may include, consist essentially of, or consist of a material different from or the same as a material of the first metallic bonding material.

The laser apparatus may include a second electrode mount (i) disposed over and in thermal contact with the second surface of the beam emitter and (ii) electrically insulated from the first electrode mount except for any conductive path through the beam emitter. The laser apparatus may include a second thermal bonding layer disposed between the beam emitter and second electrode mount. The second thermal bonding layer may improve thermal conduction between the beam emitter and the second electrode mount. The second thermal bonding layer may include, consist essentially of, or consist of (i) an array of carbon nanotubes, and (ii) a second metallic bonding material disposed within the array of carbon nanotubes so as to surround at least some of the carbon nanotubes within the array. The second metallic bonding material may include, consist essentially of, or consist of In, Sn, Au, Cu, Al, Ag, Zn, Pb, AuSn, and/or InSn. At least some (or even substantially all or all) of the carbon nanotubes within the second array of carbon nanotubes may be aligned substantially perpendicular to the second surface of the beam emitter and/or to a surface of the second electrode mount (e.g., the surface facing the beam emitter). The second metallic bonding material may include, consist essentially of, or consist of a material different from or the same as a material of the first metallic bonding material. A third metallic bonding material may be disposed between the second thermal bonding layer and the beam emitter. The third metallic bonding material may include, consist essentially of, or consist of In, Sn, Au, Cu, Al, Ag, Zn, Pb, AuSn, and/or InSn. The second metallic bonding material may include, consist essentially of, or consist of a material different from or the same as a material of the third metallic bonding material and/or of the first metallic bonding material. A third metallic bonding material may be disposed between the second thermal bonding layer and the second electrode mount. The third metallic bonding material may include, consist essentially of, or consist of In, Sn, Au, Cu, Al, Ag, Zn, Pb, AuSn, and/or InSn. The second metallic bonding material may include, consist essentially of, or consist of a material different from or the same as a material of the third metallic bonding material and/or of the first metallic bonding material.

A sealing material may be disposed along a lateral surface of the thermal bonding layer. The sealing material may prevent or retard movement of the thermal bonding layer from between the beam emitter and an electrode mount. The sealing material may include, consist essentially of, or consist of one or more electrically conductive and/or thermally conductive materials. The sealing material may include, consist essentially of, or consist of copper, aluminum, nickel, and/or chromium. A top surface of the thermal bonding layer may contact the beam emitter. A bottom surface of the thermal bonding layer may contact the first electrode mount. The laser apparatus may include a second metallic bonding material disposed on and/or around at least a portion of a lateral surface of the thermal bonding layer that spans the top and bottom surfaces. The second metallic bonding material may include, consist essentially of, or consist of a material different from or the same as a material of the first metallic bonding material. The second metallic bonding material may include, consist essentially of, or consist of In, Sn, Au, Cu, Al, Ag, Zn, Pb, AuSn, and/or InSn.

In yet another aspect, embodiments of the invention feature a laser apparatus that includes, consists essentially of, or consists of a beam emitter having first and second opposed surfaces, a first electrode mount disposed beneath the first surface of the beam emitter, and a thermal bonding layer disposed between the beam emitter and first electrode mount. The thermal bonding layer improves thermal conduction between the beam emitter and the first electrode mount. The thermal bonding layer includes, consists essentially of, or consists of (i) a plurality of discrete, spaced apart regions of a thermal bonding agent and (ii) a first thermal bonding material disposed around the regions of the thermal bonding agent so as to surround at least some of the regions of the thermal bonding agent. One or more, or even each region of the thermal bonding agent includes, consists essentially of, or consists of an array of carbon nanotubes. The first thermal bonding material is substantially free or free of carbon nanotubes.

Embodiments of the invention may include one or more of the following in any of a variety of combinations. One or more, or even each region of the thermal bonding agent may include, consist essentially of, or consist of (i) the array of carbon nanotubes, (ii) a second metallic bonding material disposed between the array of carbon nanotubes and the beam emitter, and (iii) a third metallic bonding material disposed between the array of carbon nanotubes and the first electrode mount. The second metallic bonding material and/or the third metallic bonding material may include, consist essentially of, or consist of In, Sn, Au, Cu, Al, Ag, Zn, Pb, AuSn, and/or InSn. At least some (or even substantially all or all) of the carbon nanotubes within each array of carbon nanotubes may be aligned substantially perpendicular to the first surface of the beam emitter and/or to a surface of the electrode mount (e.g., the surface facing the beam emitter). Any of the first, second, or third metallic bonding materials may include, consist essentially of, or consist of a material different from a material of any of the others. Any of the first, second, or third metallic bonding materials may include, consist essentially of, or consist of a material that is the same as a material of any of the others.

One or more, or even each region of the thermal bonding agent may include, consist essentially of, or consist of (i) the array of carbon nanotubes, and (ii) a second metallic bonding material disposed within the array of carbon nanotubes so as to surround at least some (or even substantially all or all) of the carbon nanotubes within the array. The second metallic bonding material may include, consist essentially of, or consist of In, Sn, Au, Cu, Al, Ag, Zn, Pb, AuSn, and/or InSn. At least some (or even substantially all or all) of the carbon nanotubes within each array of carbon nanotubes may be aligned substantially perpendicular to the first surface of the beam emitter and/or to a surface of the electrode mount (e.g., the surface facing the beam emitter). The second metallic bonding material may include, consist essentially of, or consist of a material different from or the same as a material of the first metallic bonding material. The beam emitter may include, consist essentially of, or consist of a diode bar emitting a plurality of discrete beams.

A sealing material may be disposed along a lateral surface of the thermal bonding layer. The sealing material may prevent or retard movement of the thermal bonding layer from between the beam emitter and an electrode mount. The sealing material may include, consist essentially of, or consist of one or more electrically conductive and/or thermally conductive materials. The sealing material may include, consist essentially of, or consist of copper, aluminum, nickel, and/or chromium.

The laser apparatus may include a second electrode mount (i) disposed over and in thermal contact with the second surface of the beam emitter and (ii) electrically insulated from the first electrode mount except for any conductive path through the beam emitter. The laser apparatus may include a second thermal bonding layer disposed between the beam emitter and second electrode mount. The second thermal bonding layer may improve thermal conduction between the beam emitter and the second electrode mount. The second thermal bonding layer may include, consist essentially of, or consist of (i) a plurality of discrete, spaced apart regions of a second thermal bonding agent and (ii) a second thermal bonding material disposed around the regions of the second thermal bonding agent so as to surround at least some of the regions of the second thermal bonding agent. One or more, or even each region of the second thermal bonding agent may include, consist essentially of, or consist of an array of carbon nanotubes. The second thermal bonding material may be substantially free or free of carbon nanotubes.

One or more, or even each region of the second thermal bonding agent may include, consist essentially of, or consist of (i) the array of carbon nanotubes, (ii) a third metallic bonding material disposed between the array of carbon nanotubes and the beam emitter, and (iii) a fourth metallic bonding material disposed between the array of carbon nanotubes and the second electrode mount. The third metallic bonding material and/or the fourth metallic bonding material may include, consist essentially of, or consist of In, Sn, Au, Cu, Al, Ag, Zn, Pb, AuSn, and/or InSn. At least some (or even substantially all or all) of the carbon nanotubes within each array of carbon nanotubes may be aligned substantially perpendicular to the second surface of the beam emitter and/or to a surface of the second electrode mount (e.g., the surface facing the beam emitter). Any of the first, second, third, or fourth metallic bonding materials may include, consist essentially of, or consist of a material different from a material of any of the others. Any of the first, second, third, or fourth metallic bonding materials may include, consist essentially of, or consist of a material that is the same as a material of any of the others.

One or more, or even each region of the second thermal bonding agent may include, consist essentially of, or consist of (i) the array of carbon nanotubes, and (ii) a third metallic bonding material disposed within the array of carbon nanotubes so as to surround at least some (or even substantially all or all) of the carbon nanotubes within the array. The third metallic bonding material may include, consist essentially of, or consist of In, Sn, Au, Cu, Al, Ag, Zn, Pb, AuSn, and/or InSn. At least some (or even substantially all or all) of the carbon nanotubes within each array of carbon nanotubes may be aligned substantially perpendicular to the second surface of the beam emitter and/or to a surface of the second electrode mount (e.g., the surface facing the beam emitter). Any of the first, second, or third metallic bonding materials may include, consist essentially of, or consist of a material different from a material of any of the others. Any of the first, second, or third metallic bonding materials may include, consist essentially of, or consist of a material that is the same as a material of any of the others.

In another aspect, embodiments of the invention feature a method of forming a thermal bonding layer. An array of carbon nanotubes is grown over a substrate. Before growth of the array of carbon nanotubes, a catalyst (e.g., a plurality of particles of a catalyst) may be formed over the substrate, and the array of carbon nanotubes may nucleate from the catalyst (e.g., from the plurality of particles). A first thermal bonding material is deposited over a top surface of the array of carbon nanotubes, and a second thermal bonding material is deposited over a bottom surface of the array of carbon nanotubes. At least some of the carbon nanotubes in the army may extend from the bottom surface to the top surface.

Embodiments of the invention may include one or more of the following in any of a variety of combinations. The first thermal bonding material may be deposited over the top surface of the array of carbon nanotubes while the array of carbon nanotubes remains disposed over the substrate. The substrate may be removed before the second thermal bonding material is deposited. The substrate may be removed before the first thermal bonding material and the second thermal bonding material are deposited. The catalyst (e.g., the particles of the catalyst) may include, consist essentially of, or consist of nickel, iron, and/or cobalt. The substrate may include, consist essentially of, or consist of a semiconductor substrate (e.g., silicon, GaAs, InP, etc.), glass, sapphire, SiC, or metal. The array of carbon nanotubes may be grown by chemical vapor deposition. An electric field may be applied during growth of the array of carbon nanotubes. Growth of at least some of the carbon nanotubes may proceed in a direction substantially parallel to a direction of the electric field. The first thermal bonding material and/or the second thermal bonding material may be deposited by physical vapor deposition, spray deposition, screen printing, and/or plating.

A third thermal bonding material may be deposited over at least a portion of at least one lateral surface of the array of carbon nanotubes spanning the top and bottom surfaces. Any of the first, second, or third metallic bonding materials may include, consist essentially of, or consist of a material different from a material of any of the others. Any of the first, second, or third metallic bonding materials may include, consist essentially of, or consist of a material that is the same as a material of any of the others. The thermal bonding layer may be pressed after deposition of the second thermal bonding material, thereby decreasing a thickness of the thermal bonding layer. The thermal bonding layer may be pressed between a beam emitter and an electrode mount. The thermal bonding layer may be disposed between a beam emitter and an electrode mount, thereby improving thermal conduction between the beam emitter and the electrode mount. A sealing material may be disposed around a lateral surface of the thermal bonding layer. The sealing material may prevent or retard movement of the thermal bonding layer from between the beam emitter and the electrode mount. The sealing material may include, consist essentially of, or consist of one or more electrically conductive and/or thermally conductive materials. The sealing material may include, consist essentially of, or consist of copper, aluminum, nickel, and/or chromium.

In yet another aspect, embodiments of the invention feature a wavelength beam combining laser system that includes, consists essentially of, or consists of a beam emitter, focusing optics, a dispersive element, a partially reflective output coupler, a first electrode mount, and a thermal bonding layer. The beam emitter emits a plurality of discrete beams (e.g., laser beams) and has first and second opposed surfaces. Each of the beams may have a different wavelength. The focusing optics focus the plurality of beams onto the dispersive element. The dispersive element receives and disperses (i.e., wavelength disperses) the received focused beams. The a partially reflective output coupler is positioned to receive the dispersed beams, transmit a portion of the dispersed beams therethrough as a multi-wavelength output beam, and reflect a second portion of the dispersed beams back toward the dispersive element and toward the beam emitter. The first electrode mount is disposed proximate (e.g., below or above) the first surface of the beam emitter. The thermal bonding layer is disposed between the beam emitter and first electrode mount. The thermal bonding layer improves thermal conduction between the beam emitter and the first electrode mount. The thermal bonding layer includes, consists essentially of, or consists of (i) an array of carbon nanotubes, (ii) a first metallic bonding material disposed between the array of carbon nanotubes and the beam emitter, and (iii) a second metallic bonding material disposed between the array of carbon nanotubes and the first electrode mount.

Embodiments of the invention may include one or more of the following in any of a variety of combinations. The dispersive element may include, consist essentially of, or consist of a diffraction grating (e.g., a reflective grating or a transmissive grating). The first metallic bonding material and/or the second metallic bonding material may include, consist essentially of, or consist of In, Sn, Au, Cu, Al, Ag, Zn, Pb, AuSn, and/or InSn. At least some (or even substantially all or all) of the carbon nanotubes within the array of carbon nanotubes may be aligned substantially perpendicular to the first surface of the beam emitter and/or to a surface of the first electrode mount (e.g., the surface facing the beam emitter).

The laser system may include a second electrode mount (i) disposed over and in thermal contact with the second surface of the beam emitter and (ii) electrically insulated from the first electrode mount except for any conductive path through the beam emitter. The laser system may include a second thermal bonding layer disposed between the beam emitter and second electrode mount. The second thermal bonding layer may improve thermal conduction between the beam emitter and the second electrode mount. The second thermal bonding layer may include, consist essentially of, or consist of (i) a second array of carbon nanotubes, (ii) a third metallic bonding material disposed between the array of carbon nanotubes and the beam emitter, and (iii) a fourth metallic bonding material disposed between the array of carbon nanotubes and the second electrode mount. The third metallic bonding material and/or the fourth metallic bonding material may include, consist essentially of, or consist of In, Sn, Au, Cu, Al, Ag, Zn, Pb, AuSn, and/or InSn. At least some (or even substantially all or all) of the carbon nanotubes within the second array of carbon nanotubes may be aligned substantially perpendicular to the second surface of the beam emitter and/or to a surface of the second electrode mount (e.g., the surface facing the beam emitter). Any of the first, second, third, or fourth metallic bonding materials (and/or any metallic bonding material disclosed herein) may include, consist essentially of, or consist of a material different from a material of any of the others. Any of the first, second, third, or fourth metallic bonding materials (and/or any metallic bonding material disclosed herein) may include, consist essentially of, or consist of a material that is the same as a material of any of the others.

A sealing material may be disposed along a lateral surface of the thermal bonding layer. The sealing material may prevent or retard movement of the thermal bonding layer from between the beam emitter and an electrode mount. The sealing material may include, consist essentially of, or consist of one or more electrically conductive and/or thermally conductive materials. The sealing material may include, consist essentially of, or consist of copper, aluminum, nickel, and/or chromium. A top surface of the thermal bonding layer may contact the beam emitter. A bottom surface of the thermal bonding layer may contact the first electrode mount. The laser system may include a third metallic bonding material disposed on and/or around at least a portion of a lateral surface of the thermal bonding layer that spans the top and bottom surfaces. The third metallic bonding material may include, consist essentially of, or consist of a material different from or the same as a material of the first and/or second metallic bonding materials. The third metallic bonding material may include, consist essentially of, or consist of In, Sn, Au, Cu, Al, Ag, Zn, Pb, AuSn, and/or InSn. The laser system may include a third metallic bonding material disposed within the array of carbon nanotubes. The third metallic bonding material may surround at least some (or even all or substantially all) of the carbon nanotubes within the array. The third metallic bonding material may include, consist essentially of, or consist of a material different from or the same as a material of the first and/or second metallic bonding materials. The third metallic bonding material may include, consist essentially of, or consist of In, Sn, Au, Cu, Al, Ag, Zn, Pb, AuSn, and/or InSn.

In another aspect, embodiments of the invention feature a wavelength beam combining laser system that includes, consists essentially of, or consists of a beam emitter, focusing optics, a dispersive element, a partially reflective output coupler, a first electrode mount, and a thermal bonding layer. The beam emitter emits a plurality of discrete beams (e.g., laser beams) and has first and second opposed surfaces. Each of the beams may have a different wavelength. The focusing optics focus the plurality of beams onto the dispersive element. The dispersive element receives and disperses (i.e., wavelength disperses) the received focused beams. The a partially reflective output coupler is positioned to receive the dispersed beams, transmit a portion of the dispersed beams therethrough as a multi-wavelength output beam, and reflect a second portion of the dispersed beams back toward the dispersive element and toward the beam emitter. The first electrode mount is disposed proximate (e.g., below or above) the first surface of the beam emitter. The thermal bonding layer is disposed between the beam emitter and first electrode mount. The thermal bonding layer improves thermal conduction between the beam emitter and the first electrode mount. The thermal bonding layer includes, consists essentially of, or consists of (i) an array of carbon nanotubes, and (ii) a first metallic bonding material disposed within the array of carbon nanotubes so as to surround at least some of the carbon nanotubes within the array.

Embodiments of the invention may include one or more of the following in any of a variety of combinations. The dispersive element may include, consist essentially of, or consist of a diffraction grating (e.g., a reflective grating or a transmissive grating). The first metallic bonding material may include, consist essentially of, or consist of In, Sn, Au, Cu, Al, Ag, Zn, Pb, AuSn, and/or InSn. At least some (or even substantially all or all) of the carbon nanotubes within the array of carbon nanotubes may be aligned substantially perpendicular to the first surface of the beam emitter and/or to a surface of the first electrode mount (e.g., the surface facing the beam emitter).

The laser system may include a second metallic bonding material disposed between the thermal bonding layer and the beam emitter. The second metallic bonding material may include, consist essentially of, or consist of In, Sn, Au, Cu, Al, Ag, Zn, Pb, AuSn, and/or InSn. The second metallic bonding material may include, consist essentially of, or consist of a material different from or the same as a material of the first metallic bonding material.

The laser system may include a second metallic bonding material disposed between the thermal bonding layer and the first electrode mount. The second metallic bonding material may include, consist essentially of, or consist of In, Sn, Au, Cu, Al, Ag, Zn, Pb, AuSn, and/or InSn. The second metallic bonding material may include, consist essentially of, or consist of a material different from or the same as a material of the first metallic bonding material.

The laser system may include a second electrode mount (i) disposed over and in thermal contact with the second surface of the beam emitter and (ii) electrically insulated from the first electrode mount except for any conductive path through the beam emitter. The laser system may include a second thermal bonding layer disposed between the beam emitter and second electrode mount. The second thermal bonding layer may improve thermal conduction between the beam emitter and the second electrode mount. The second thermal bonding layer may include, consist essentially of, or consist of (i) an array of carbon nanotubes, and (ii) a second metallic bonding material disposed within the array of carbon nanotubes so as to surround at least some of the carbon nanotubes within the array. The second metallic bonding material may include, consist essentially of, or consist of In, Sn, Au, Cu, Al, Ag, Zn, Pb, AuSn, and/or InSn. At least some (or even substantially all or all) of the carbon nanotubes within the second array of carbon nanotubes may be aligned substantially perpendicular to the second surface of the beam emitter and/or to a surface of the second electrode mount (e.g., the surface facing the beam emitter). The second metallic bonding material may include, consist essentially of, or consist of a material different from or the same as a material of the first metallic bonding material. A third metallic bonding material may be disposed between the second thermal bonding layer and the beam emitter. The third metallic bonding material may include, consist essentially of, or consist of In, Sn, Au, Cu, Al, Ag, Zn, Pb, AuSn, and/or InSn. The second metallic bonding material may include, consist essentially of, or consist of a material different from or the same as a material of the third metallic bonding material and/or of the first metallic bonding material. A third metallic bonding material may be disposed between the second thermal bonding layer and the second electrode mount. The third metallic bonding material may include, consist essentially of, or consist of In, Sn, Au, Cu, Al, Ag, Zn, Pb, AuSn, and/or InSn. The second metallic bonding material may include, consist essentially of, or consist of a material different from or the same as a material of the third metallic bonding material and/or of the first metallic bonding material.

A sealing material may be disposed along a lateral surface of the thermal bonding layer. The sealing material may prevent or retard movement of the thermal bonding layer from between the beam emitter and an electrode mount. The sealing material may include, consist essentially of, or consist of one or more electrically conductive and/or thermally conductive materials. The sealing material may include, consist essentially of, or consist of copper, aluminum, nickel, and/or chromium. A top surface of the thermal bonding layer may contact the beam emitter. A bottom surface of the thermal bonding layer may contact the first electrode mount. The laser system may include a second metallic bonding material disposed on and/or around at least a portion of a lateral surface of the thermal bonding layer that spans the top and bottom surfaces. The second metallic bonding material may include, consist essentially of, or consist of a material different from or the same as a material of the first metallic bonding material. The second metallic bonding material may include, consist essentially of, or consist of In, Sn, Au, Cu, Al, Ag, Zn, Pb, AuSn, and/or InSn.

In yet another aspect, embodiments of the invention feature a wavelength beam combining laser system that includes, consists essentially of, or consists of a beam emitter, focusing optics, a dispersive element, a partially reflective output coupler, a first electrode mount, and a thermal bonding layer. The beam emitter emits a plurality of discrete beams (e.g., laser beams) and has first and second opposed surfaces. Each of the beams may have a different wavelength. The focusing optics focus the plurality of beams onto the dispersive element. The dispersive element receives and disperses (i.e., wavelength disperses) the received focused beams. The a partially reflective output coupler is positioned to receive the dispersed beams, transmit a portion of the dispersed beams therethrough as a multi-wavelength output beam, and reflect a second portion of the dispersed beams back toward the dispersive element and toward the beam emitter. The first electrode mount is disposed proximate (e.g., below or above) the first surface of the beam emitter. The thermal bonding layer is disposed between the beam emitter and first electrode mount. The thermal bonding layer improves thermal conduction between the beam emitter and the first electrode mount. The thermal bonding layer includes, consists essentially of, or consists of (i) a plurality of discrete, spaced apart regions of a thermal bonding agent and (ii) a first thermal bonding material disposed around the regions of the thermal bonding agent so as to surround at least some of the regions of the thermal bonding agent. One or more, or even each region of the thermal bonding agent includes, consists essentially of, or consists of an array of carbon nanotubes. The first thermal bonding material is substantially free or free of carbon nanotubes.

Embodiments of the invention may include one or more of the following in any of a variety of combinations. The dispersive element may include, consist essentially of, or consist of a diffraction grating (e.g., a reflective grating or a transmissive grating). One or more, or even each region of the thermal bonding agent may include, consist essentially of, or consist of (i) the array of carbon nanotubes, (ii) a second metallic bonding material disposed between the array of carbon nanotubes and the beam emitter, and (iii) a third metallic bonding material disposed between the array of carbon nanotubes and the first electrode mount. The second metallic bonding material and/or the third metallic bonding material may include, consist essentially of, or consist of In, Sn, Au, Cu, Al, Ag, Zn, Pb, AuSn, and/or InSn. At least some (or even substantially all or all) of the carbon nanotubes within each array of carbon nanotubes may be aligned substantially perpendicular to the first surface of the beam emitter and/or to a surface of the electrode mount (e.g., the surface facing the beam emitter). Any of the first, second, or third metallic bonding materials may include, consist essentially of, or consist of a material different from a material of any of the others. Any of the first, second, or third metallic bonding materials may include, consist essentially of, or consist of a material that is the same as a material of any of the others.

One or more, or even each region of the thermal bonding agent may include, consist essentially of, or consist of (i) the array of carbon nanotubes, and (ii) a second metallic bonding material disposed within the array of carbon nanotubes so as to surround at least some (or even substantially all or all) of the carbon nanotubes within the array. The second metallic bonding material may include, consist essentially of, or consist of In, Sn, Au, Cu, Al, Ag, Zn, Pb, AuSn, and/or InSn. At least some (or even substantially all or all) of the carbon nanotubes within each array of carbon nanotubes may be aligned substantially perpendicular to the first surface of the beam emitter and/or to a surface of the electrode mount (e.g., the surface facing the beam emitter). The second metallic bonding material may include, consist essentially of, or consist of a material different from or the same as a material of the first metallic bonding material.

A sealing material may be disposed along a lateral surface of the thermal bonding layer. The sealing material may prevent or retard movement of the thermal bonding layer from between the beam emitter and an electrode mount. The sealing material may include, consist essentially of, or consist of one or more electrically conductive and/or thermally conductive materials. The sealing material may include, consist essentially of, or consist of copper, aluminum, nickel, and/or chromium.

The laser system may include a second electrode mount (i) disposed over and in thermal contact with the second surface of the beam emitter and (ii) electrically insulated from the first electrode mount except for any conductive path through the beam emitter. The laser apparatus may include a second thermal bonding layer disposed between the beam emitter and second electrode mount. The second thermal bonding layer may improve thermal conduction between the beam emitter and the second electrode mount. The second thermal bonding layer may include, consist essentially of, or consist of (i) a plurality of discrete, spaced apart regions of a second thermal bonding agent and (ii) a second thermal bonding material disposed around the regions of the second thermal bonding agent so as to surround at least some of the regions of the second thermal bonding agent. One or more, or even each region of the second thermal bonding agent may include, consist essentially of, or consist of an array of carbon nanotubes. The second thermal bonding material may be substantially free or free of carbon nanotubes.

One or more, or even each region of the second thermal bonding agent may include, consist essentially of, or consist of (i) the array of carbon nanotubes, (ii) a third metallic bonding material disposed between the array of carbon nanotubes and the beam emitter, and (iii) a fourth metallic bonding material disposed between the array of carbon nanotubes and the second electrode mount. The third metallic bonding material and/or the fourth metallic bonding material may include, consist essentially of, or consist of In, Sn, Au, Cu, Al, Ag, Zn, Pb, AuSn, and/or InSn. At least some (or even substantially all or all) of the carbon nanotubes within each array of carbon nanotubes may be aligned substantially perpendicular to the second surface of the beam emitter and/or to a surface of the second electrode mount (e.g., the surface facing the beam emitter). Any of the first, second, third, or fourth metallic bonding materials may include, consist essentially of, or consist of a material different from a material of any of the others. Any of the first, second, third, or fourth metallic bonding materials may include, consist essentially of, or consist of a material that is the same as a material of any of the others.

One or more, or even each region of the second thermal bonding agent may include, consist essentially of, or consist of (i) the array of carbon nanotubes, and (ii) a third metallic bonding material disposed within the array of carbon nanotubes so as to surround at least some (or even substantially all or all) of the carbon nanotubes within the array. The third metallic bonding material may include, consist essentially of, or consist of In, Sn, Au, Cu, Al, Ag, Zn, Pb, AuSn, and/or InSn. At least some (or even substantially all or all) of the carbon nanotubes within each array of carbon nanotubes may be aligned substantially perpendicular to the second surface of the beam emitter and/or to a surface of the second electrode mount (e.g., the surface facing the beam emitter). Any of the first, second, or third metallic bonding materials may include, consist essentially of, or consist of a material different from a material of any of the others. Any of the first, second, or third metallic bonding materials may include, consist essentially of, or consist of a material that is the same as a material of any of the others.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the terms "substantially" and "approximately" mean ±10%, and in some embodiments, ±5%. The term "consists essentially of" means excluding other materials that contribute to function, unless otherwise defined herein. Nonetheless, such other materials may be present, collectively or individually, in trace amounts. Herein, the terms "radiation" and "light" are utilized interchangeably unless otherwise indicated. Herein, "downstream" or "optically downstream," is utilized to indicate the relative placement of a second element that a light beam strikes after encountering a first element, the first element being "upstream," or "optically upstream" of the second element. Herein, "optical distance" between two components is the distance between two components that is actually traveled by light beams; the optical distance may be, but is not necessarily, equal to the physical distance between two components due to, e.g., reflections from mirrors or other changes in propagation direction experienced by the light traveling from one of the components to the other.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figure 1:
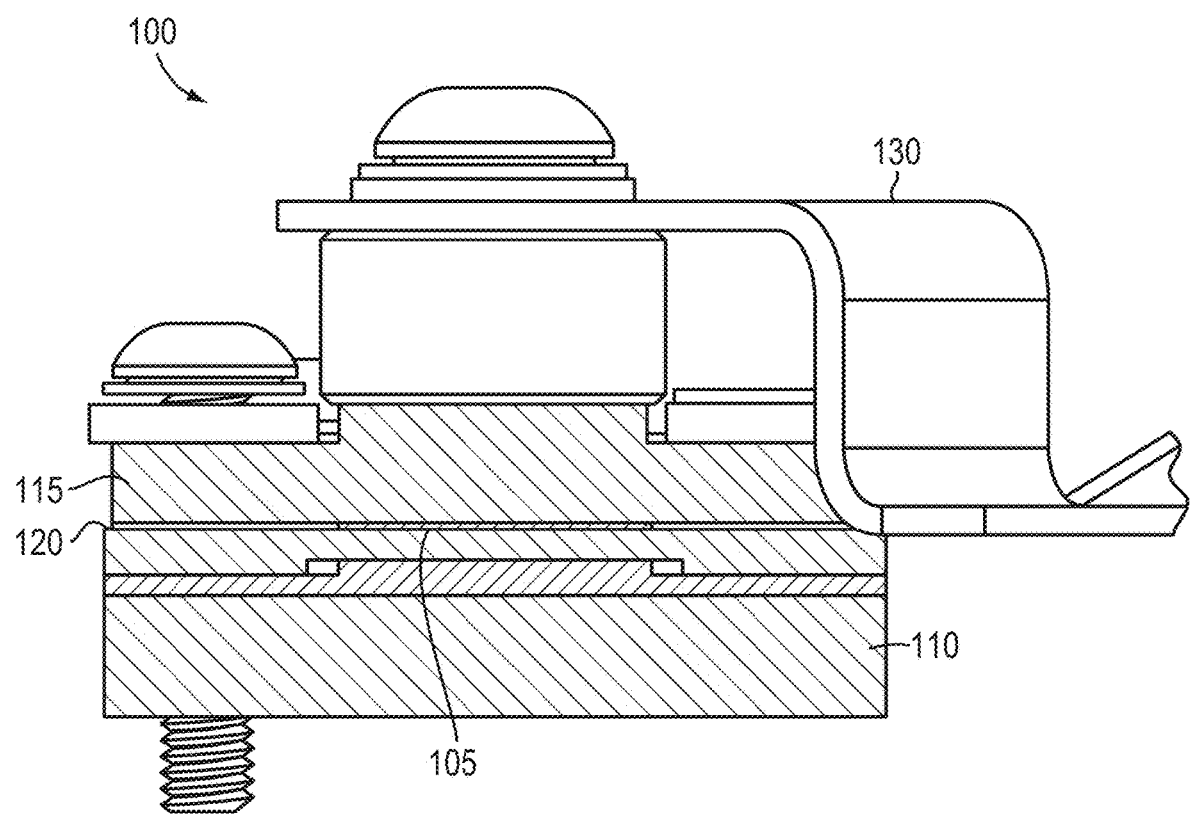
FIGS. 1 and 2 are, respectively, a side view and a perspective view of a packaged laser in accordance with embodiments of the invention.
Figure 2:
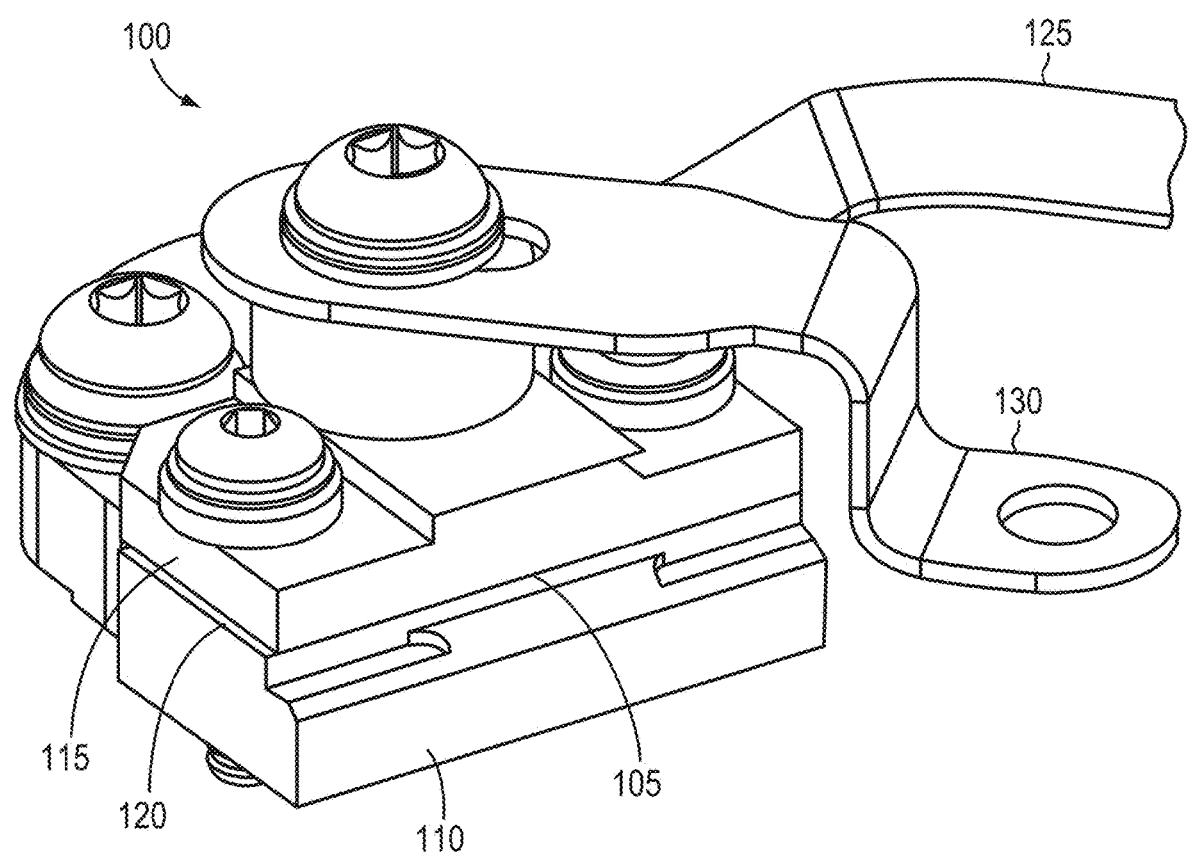

FIGS. 1 and 2 depict portions of an exemplary packaged laser 100 in accordance with embodiments of the present invention. As shown, the laser 100 includes a beam emitter 105 sandwiched between two electrode mounts 110, 115. The beam emitter 105 may include or consist essentially of, e.g., a laser diode, a diode bar, an array of laser diodes, an array of diode bars, or one or more vertical cavity surface-emitting lasers (VCSELs). The electrode mounts 110, 115 are thermally connected to the beam emitter 105 (as detailed below) and each electrically connected to one of the electrodes (i.e., the anode and the cathode) of the beam emitter 105. For example, the electrode mount 110 may be electrically connected to the anode of beam emitter 105 and the electrode mount 115 may be electrically connected to the cathode of beam emitter 105, or vice versa. The electrode mounts 110, 115 are typically highly thermally and electrically conductive; thus, in various embodiments, the electrode mounts 110, 115 include, consist essentially of, or consist of one or more metals such as copper, silver, or gold. An insulating layer 120 is disposed around the beam emitter 105 and between the electrode mounts 110, 115, thereby electrically isolating the electrode mounts 110, 115 from each other. As shown, the electrode mounts 110, 115 may be fastened together and to the beam emitter 105 via, e.g., one or more fasteners such as screws or clamps, which may also attach the electrode mounts to a housing. Conductive contacts 125, 130 are connected to and extend from the electrode mounts 110, 115 in order to facilitate interconnection of the laser 100 to, for example, other laser devices (in series or in parallel) or to a source of electrical power (e.g., a current source). Laser 100 may also incorporate one or more features described in, and/or be fabricated in accordance with, U.S. Pat. No. 9,178,333, filed on Mar. 24, 2015, the entire disclosure of which is incorporated herein by reference. The details of packaged laser 100 are exemplary, and packaged lasers 100 may include or consist essentially of a beam emitter 105 thermally (and, in various embodiments, electrically) connected to one or more electrode mounts or heat sinks; the size, shape, and other characteristics of electrode mounts 110, 115 are not limitations of the present invention.

Figure 3A:
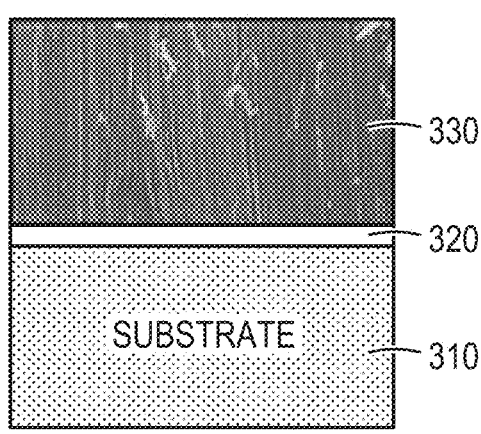
FIGS. 3A-3E are side views of various steps in the fabrication of a thermal bonding material in accordance with embodiments of the invention.

Embodiments of the invention feature a thermal bonding material that includes, consists essentially of, or consists of a metal/carbon nanotube composite to facilitate conduction of heat away from beam emitter 105 during, for example, testing, burn-in, and operation thereof. FIGS. 3A-3E depict the fabrication of a thermal bonding material 300 in accordance with embodiments of the present invention. In an exemplary embodiment, the fabrication of thermal bonding material 300 includes the formation of an array of carbon nanotubes via, e.g., chemical vapor deposition (CVD). As shown in FIG. 3A, a substrate 310 (e.g., a semiconductor substrate such as a silicon substrate) has a catalyst layer 320 disposed thereon. The catalyst layer 320 may include, consist essentially of, or consist of a plurality of catalyst particles for subsequent formation of carbon nanotubes thereon. For example, the catalyst particles may include, consist essentially of, or consist of one or more metals such as nickel, iron, and/or cobalt. The catalyst layer 320 may be a collection of discrete particles that each "seed" the growth of one or more carbon nanotubes thereon. The particles of catalyst layer 320 may be formed via, for example, deposition through a masking layer or deposition of a blanket layer of metal and etching thereof.

As shown in FIG. 3A, a carbon nanotube array 330 may be formed on the catalyst layer 320 by any of a variety of CVD techniques, e.g., plasma-enhanced CVD. In an exemplary process, the substrate 310 and catalyst layer 320 are placed into a CVD reactor and heated (e.g., to a temperature between 500° C. and 800° C.). Then, a process gas (e.g., ammonia, nitrogen, and/or hydrogen) and a carbon-containing gas (e.g., acetylene, ethylene, and/or methane) are flowed into the reactor. The carbon nanotubes of the nanotube array 330 nucleate and grow on the catalyst particles of the catalyst layer 320. In various embodiments, an electric field may be applied during formation of the carbon nanotubes; in this manner, the growth direction of the carbon nanotubes may be controlled to be parallel to the direction of the electric field. Thus, in various embodiments, the nanotube array 330 includes, consists essentially of, or consists of a collection of carbon nanotubes aligned substantially parallel with each other (e.g., approximately perpendicular to the surface of substrate 310).

Figure 3B:
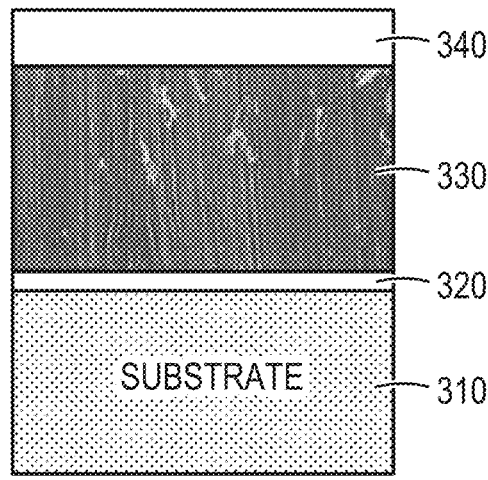
Figure 3C:
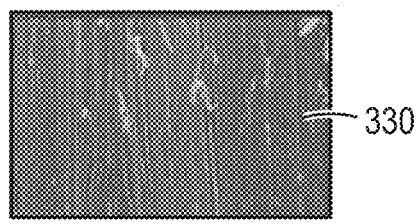
Figure 3D:
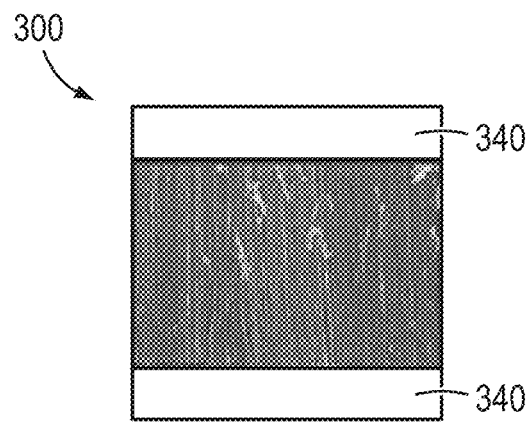
Figure 3E:
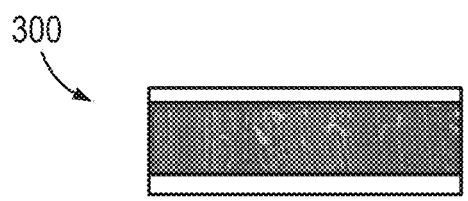

As mentioned above, thermal bonding materials 300 in accordance with embodiments of the invention advantageously incorporate one or more bonding layers 340 that facilitate thermal (and, in various embodiments, electrical) bonding of the nanotube array 330 to the beam emitter 105. Such bonding layers 340 may be disposed on one or more surfaces of the nanotube array 330, e.g., the top and/or bottom surfaces (i.e., the surfaces substantially perpendicular to the axes of the nanotubes). In various embodiments, bonding layers 340 may also be disposed on one or more (or even all) of the lateral surfaces of the nanotube array 330 that span the top and bottom surfaces. The bonding layers 340 may include, consist essentially of, or consist of one or more metals, e.g., In, Sn, AuSn, and/or InSn, and/or mixtures or alloys containing two or more of these or one or more of these with one or more other metals. The bonding layers 340 may be disposed on the nanotube array 330 by any of a variety of different techniques, for example, physical vapor deposition (e.g., sputtering or electron-beam deposition), spray deposition (e.g., plasma spray or cold spray), screen printing, and/or plating. Each of the bonding layers 340 may have a thickness of, for example, 1 µm to 10 µm (e.g., 2 µm to 3 µm). As shown in FIG. 3B, a bonding layer 340 may be formed on the nanotube array 330 while the nanotube array 330 is present atop the substrate 310. The nanotube array 330 may then be detached from the substrate 310, flipped over, and another bonding layer 340 may be formed on the opposite side, as shown in FIG. 3D. In other embodiments, the nanotube array 330 may be peeled away from the substrate 310, as shown in FIG. 3C, and then one or more bonding layers 340 may be formed on one or more (or even all) surfaces of the nanotube array 330 in one or more deposition steps. In various embodiments, as shown in FIG. 3E, after formation of one or more bonding layers 340, the thermal bonding material 300 may be pressed, thereby decreasing its thickness and maximizing electrical and thermal contact between the thermal bonding layers 340 and the nanotube array 330. In other embodiments, the thermal bonding material 300 may be pressed after being disposed between beam emitter 105 and an electrode mount or heat sink (as described below). In various embodiments, the thermal bonding material 300 may be annealed at an elevated temperature before or after being disposed proximate beam emitter 105.

In various embodiments, after the deposition of a bonding layer 340 on an initial nanotube array 330, as shown in FIG. 3B, an additional catalyst layer may be disposed on the bonding layer 340 and an additional carbon nanotube array may be formed (e.g., by CVD) over the bonding layer 340. In this manner, layered structures containing two or more discrete layers of carbon nanotube arrays 330 separated by bonding layers 340 may be formed. In other embodiments, structures such as that depicted in FIG. 3D may be stacked atop each other to form structures incorporating two or more discrete layers of carbon nanotube arrays 330.

In various embodiments, all or a portion of a bonding layer 340 may infiltrate into some or all of the spaces between individual carbon nanotubes in a carbon nanotube array 330 to form a thermal bonding material in which carbon nanotubes are embedded within a matrix that includes, consists essentially of, or consists of the bonding layer 340 material. For example, a spacing of catalyst particles in a catalyst layer 320 may be adjusted (e.g., increased), and deposition of all or part of the bonding layer 340 may result in deposition of the bonding layer material within the carbon nanotube array 330 itself, occupying or substantially filling gaps between carbon nanotubes.

Figure 4A:
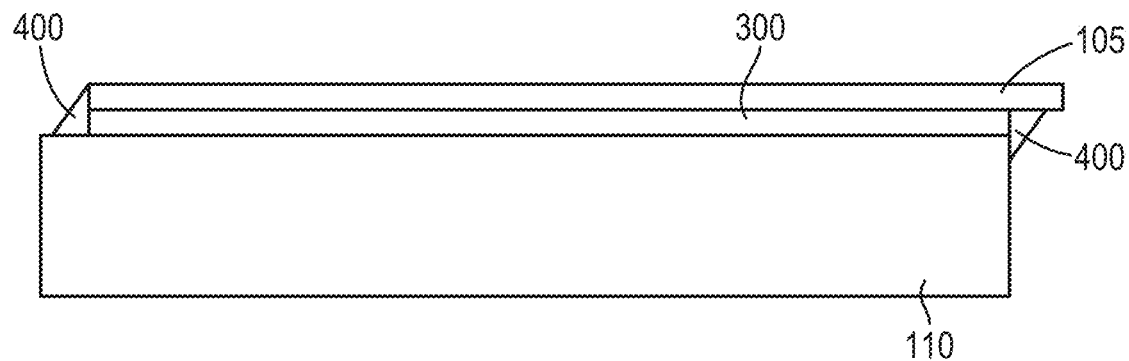
FIGS. 4A and 4B are cross-sectional views of portions of laser devices incorporating adhesive layers for containing thermal bonding material in accordance with embodiments of the invention.
Figure 4B:
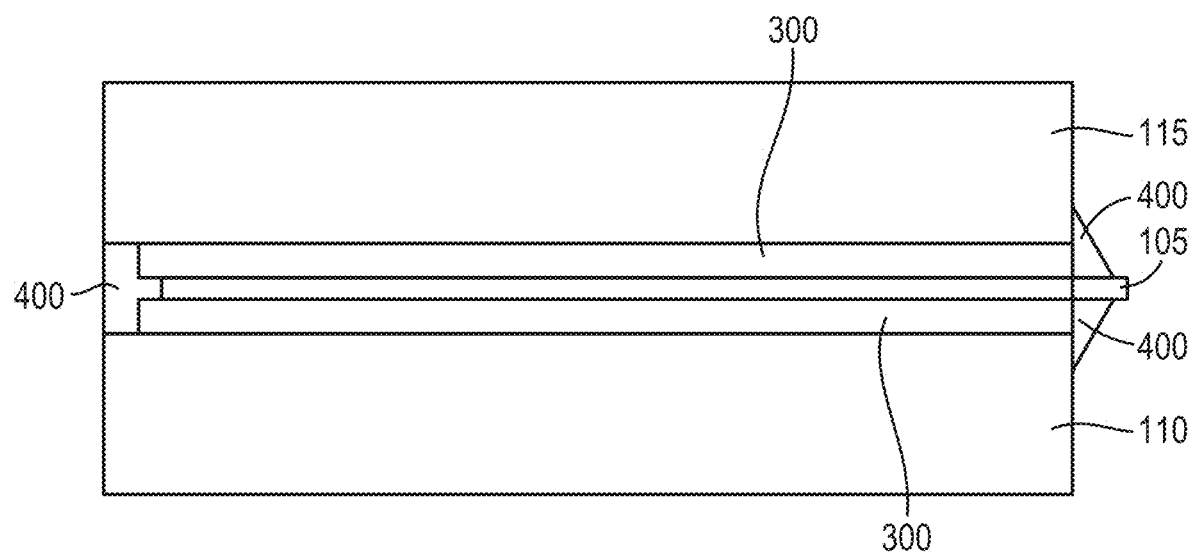

After fabrication of the thermal bonding material 300, it may be utilized to enable and/or enhance thermal (and, in various embodiments, electrical) contact between one or more surfaces (and/or electrical contacts) of beam emitter 105 and electrode mount 110 and/or electrode mount 115, as shown in FIGS. 4A and 4B. In various embodiments, laser devices incorporating beam emitter 105 and one or more layers of thermal bonding material 300 may also incorporate one or more regions of an adhesive 400. As shown, the adhesive 400 may be disposed around and in contact with one or more sides of the beam emitter 105 and the electrode mount 110 and/or the electrode mount 115 at the interface therebetween in order to form a barrier to egress of the thermal bonding material 300 (e.g., the bonding layers 340).

Figure 5A:
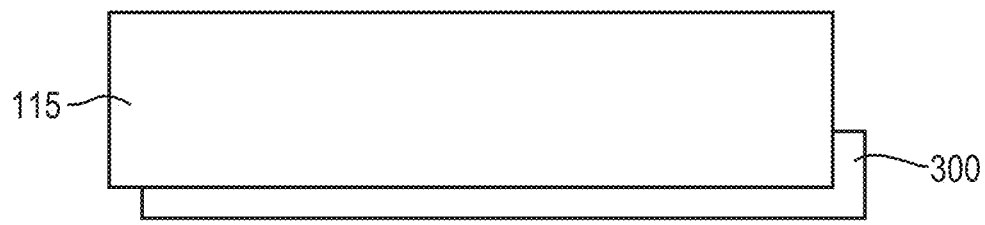
FIGS. 5A-5D are cross-sectional views of components of laser devices undergoing various steps of a sealing process in accordance with embodiments of the invention.
Figure 5A:
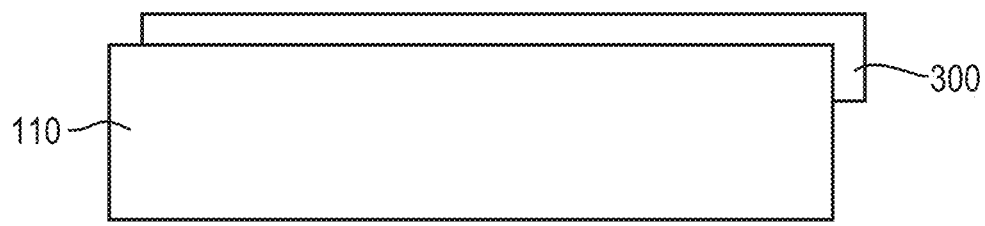

Various embodiments of the present invention feature sealing materials to minimize or reduce creep of one or more thermal bonding layers (i.e., one or more layers including, consisting essentially of, or consisting of a thermal bonding material). FIG. 5A depicts electrode mounts 110, 115 each with a thermal bonding layer 300 disposed thereon. As mentioned above, a thermal bonding layer 300 may include, consist essentially of, or consist of a thermal bonding material. The thermal bonding material may include, consist essentially of, or consist of a metal/carbon nanotube composite as described herein. The thermal bonding layer 300 may even include, consist essentially of, or consist of one or more discrete portions (e.g., a mesh structure or discrete particles or regions) of a metal/carbon nanotube composite in combination with (e.g., interspersed in), another thermal bonding material, for example, a thermally conductive solder, foil, liquid, paste, or gel material that includes, consists essentially of, or consists of one or more materials such as indium, lead, tin, silver, and/or a mixture or an alloy thereof or with one or more other metals. As shown in FIG. 5D, the thermal bonding layers 300 provide a thermal connection between the electrode mounts 110, 115 and the beam emitter 105. (Although FIGS. 5A-5D depict both electrode mounts 110, 115 being at least partially sealed and subsequently thermally connected to beam emitter 105, embodiments of the invention include laser devices in which only one of electrode mounts 110, 115 is utilized.)

Figure 5B:
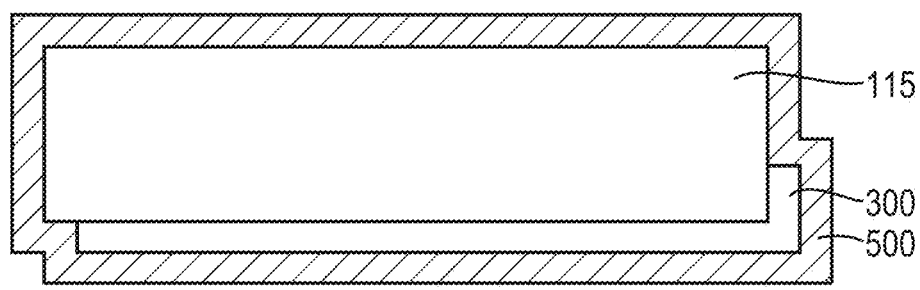
Figure 5B:
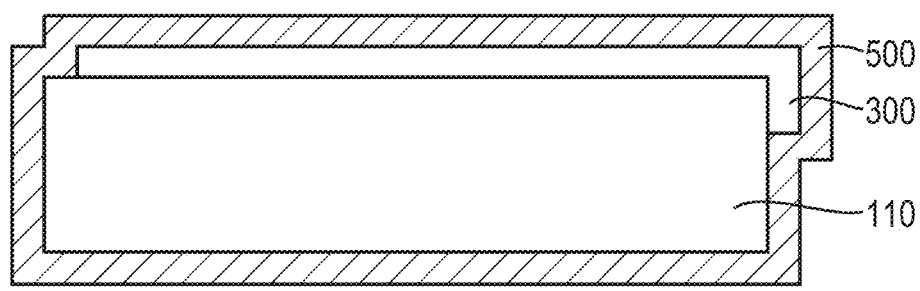

As shown in FIG. 5B, each of the electrode mounts 110, 115 with the thermal bonding layer 300 applied thereto may be at least partially sealed with a sealing material 500 to prevent creep of the thermal bonding material from areas between the beam emitter 105 and the electrode mounts. The sealing material 500 may extend around substantially the entire surface area of the electrode mount and associated thermal bonding layer 300. The sealing material 500 is generally substantially impervious to transport of the thermal bonding material therethrough, and therefore substantially prevents egress of the thermal bonding material in the assembled laser device. The sealing material 500 may include, consist essentially of, or consist of one or more metals, e.g., thermally conductive metals, and it may have a melting point higher than that of the thermal bonding layer 335 (e.g., of the thermal bonding material). For example, the sealing material 500 may include, consist essentially of, or consist of copper, aluminum, nickel, chromium, or an alloy of two or more of those metals or one or more of those metals with one or more other metals. The sealing material 500 may therefore also be electrically conductive. The sealing material 500 may have a hardness higher than that of the thermal bonding material, or at least of metal portions (or non-carbon-nanotube portions) thereof. In various embodiments, the sealing material 500 and the thermal bonding material are substantially mutually insoluble (i.e., no more than approximately 10%, or even no more than approximately 5%, of the sealing material 500 or the thermal bonding material may dissolve into the other to form a solid solution), at least at temperatures of typical operation of the assembled laser device (e.g., temperatures reached by components in contact with the thermal bonding material) or lower.

The sealing material 500 may be applied to the electrode mounts and thermal bonding layers via any of a variety of different techniques. For example, the sealing material 500 may be deposited by a technique such as electroplating, electroless deposition, chemical vapor deposition, or sputtering. In an electroplating process in accordance with embodiments of the invention, as known in the art, the component to be sealed is immersed in a bath containing ions of the sealing material 500 and/or an anode including, consisting essentially of, or consisting of the sealing material 500, and an applied current results in the deposition of the ions onto the component, which acts as the cathode. In an electroless deposition process in accordance with embodiments of the invention, as known in the art, the electroplating current source is absent, and the bath contains a reducing agent (e.g., a hydrogen-based reducer such as hypophosphite or a low molecular weight aldehyde) that drives the plating reaction.

Figure 5C:
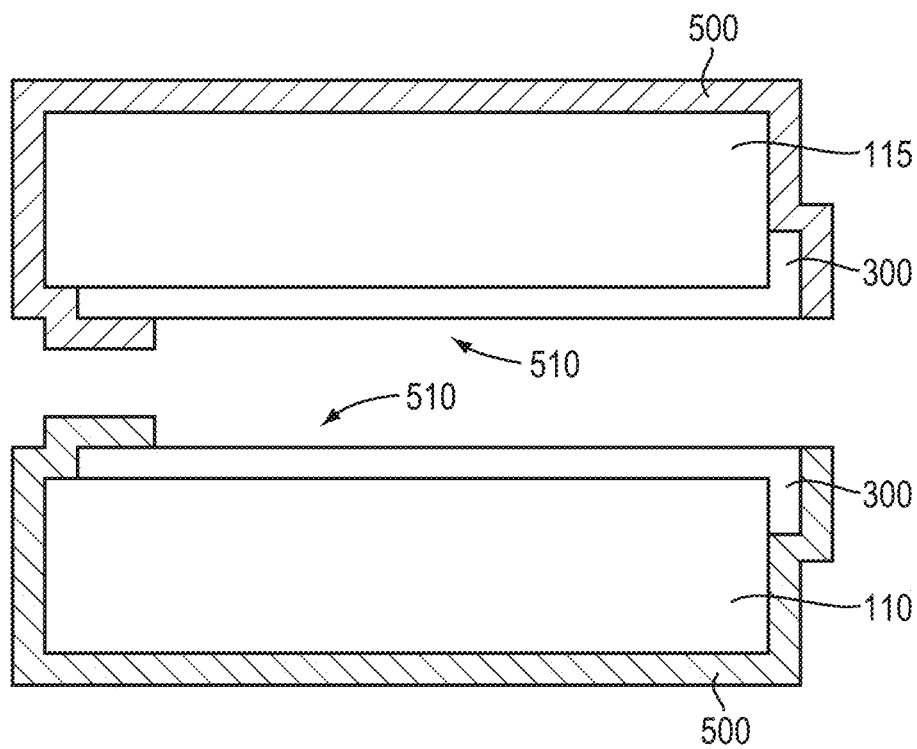
Figure 5D:
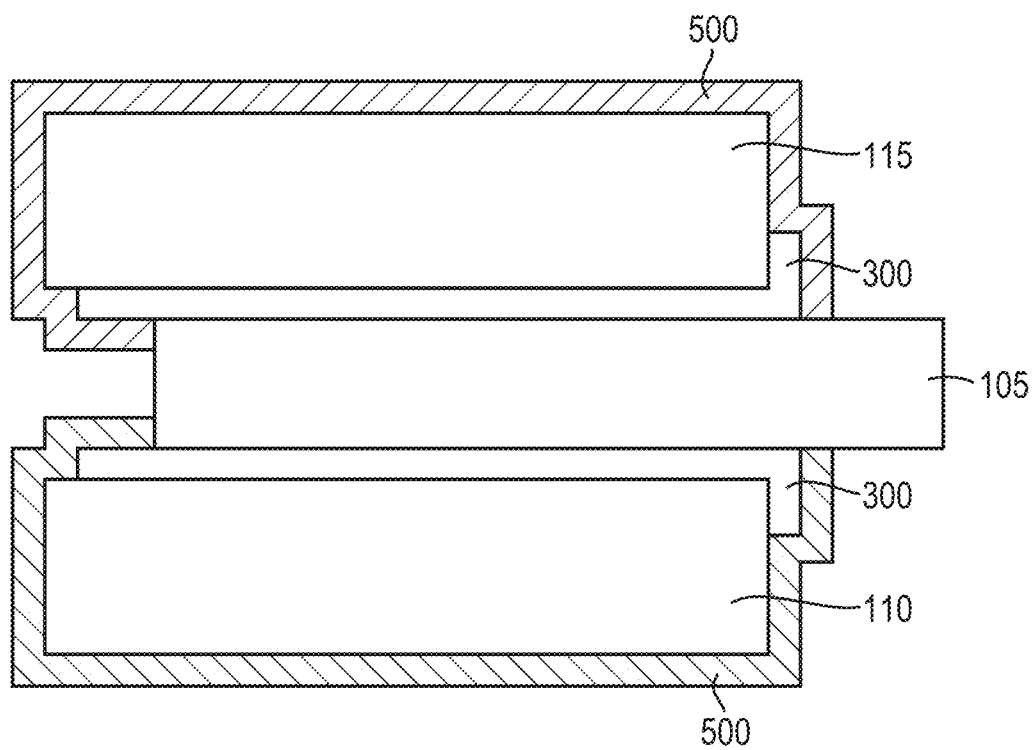

In various embodiments of the invention one or more portions of the sealing material 500 may be removed from the electrode mount and/or the thermal bonding layer 300. As shown in FIG. 5C, portions of the sealing material 500 may be removed from the thermal bonding layers 300 which are intended to directly contact the beam emitter in the assembled laser device, thereby forming exposed regions 510. As shown in FIG. 5D, the beam emitter 105 may be disposed between sealed electrode mounts 110, 115 such that it directly contacts the thermal bonding layers 300 (thereby ensuring good thermal contact) while the remaining portions of the sealing material 500 prevent egress of the thermal bonding material from the interfaces between the beam emitter 105 and the electrode mounts 110, 115. The portions of the sealing material 500 on regions 510 may be removed by, e.g., etching (for example, where other regions of the sealing material 500 are masked by a protective layer inert to the etchant) or mechanical removal methods such as machining or grinding.

In other embodiments of the invention, the sealing material 500 is not formed on the regions 510 during the initial sealing process. In such embodiments, regions 510 may be initially covered or coated with a masking material such as wax, tape, etc. The sealing material 500 is not deposited on the masked-off regions 510, and after the depositing process (e.g., electroplating or electroless deposition), the masking material is simply removed to reveal regions 510 as shown in FIG. 5C.

Figure 6A:
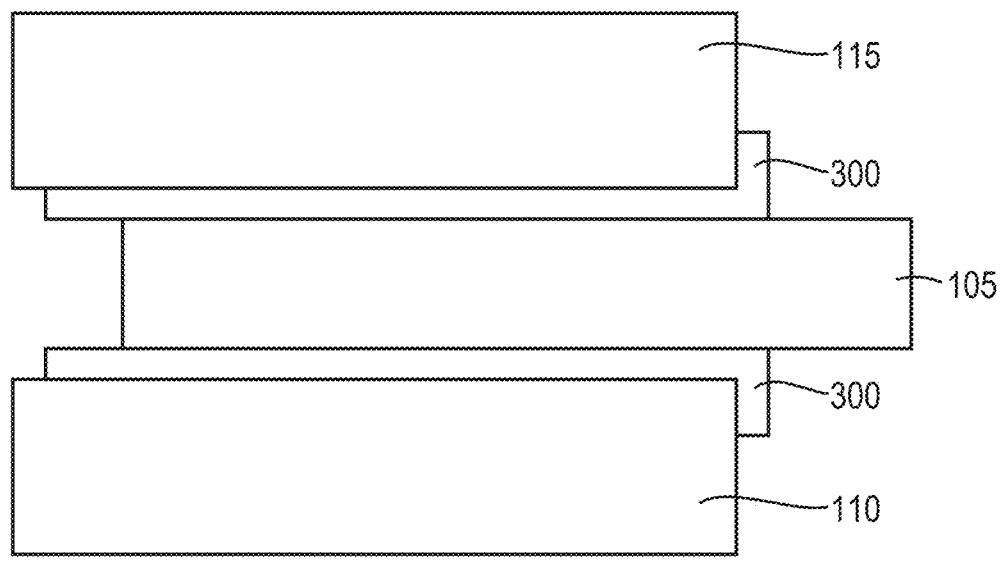
FIGS. 6A and 6B are cross-sectional views of components of laser devices undergoing various steps of a sealing process in accordance with embodiments of the invention.
Figure 6B:
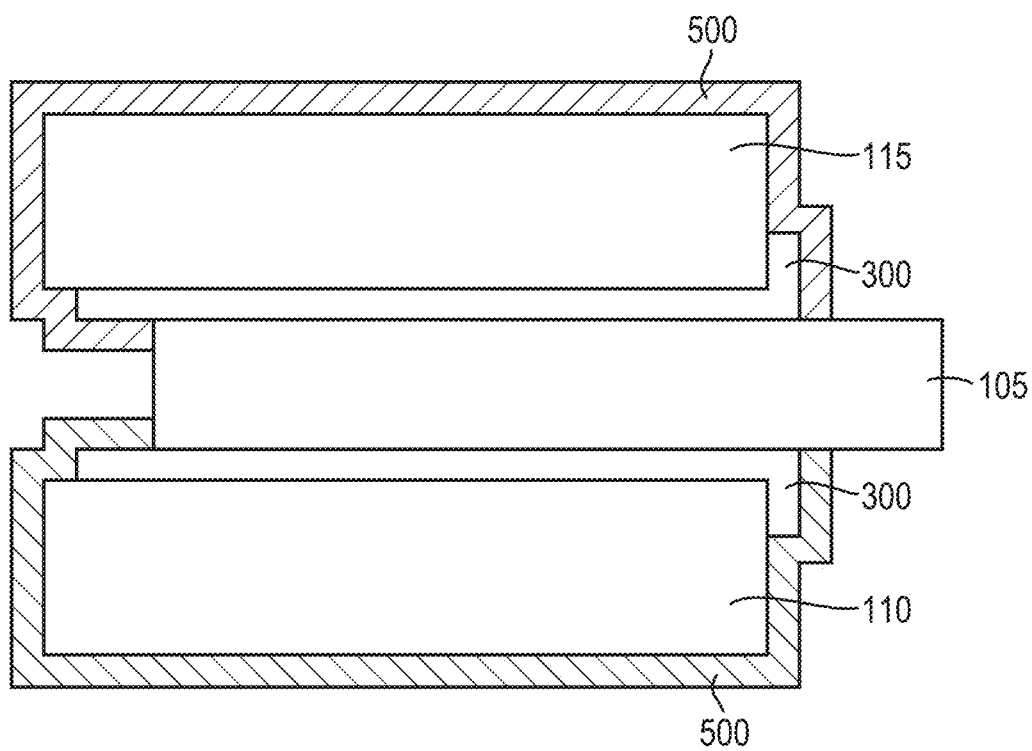

As shown in FIG. 6A, in accordance with embodiments of the present invention, various components of the laser device may be assembled together before application of the sealing material. As shown, the electrode mounts 110, 115 may be affixed to the beam emitter 105 with thermal bonding layers 300 therebetween prior to the application of the sealing material. As shown in FIG. 6B, the sealing material 500 may be applied to the entire assembly shown in FIG. 6A, thereby sealing the thermal bonding layers 300 and preventing egress of the thermal bonding material during operation of the laser device. As detailed above, exposed portions of the beam emitter 105 may either be masked off, thereby preventing any deposition of the sealing material 500, or the sealing material 500 may be deposited on such areas and subsequently removed by, e.g., etching or mechanical removal techniques.

Figure 7A:
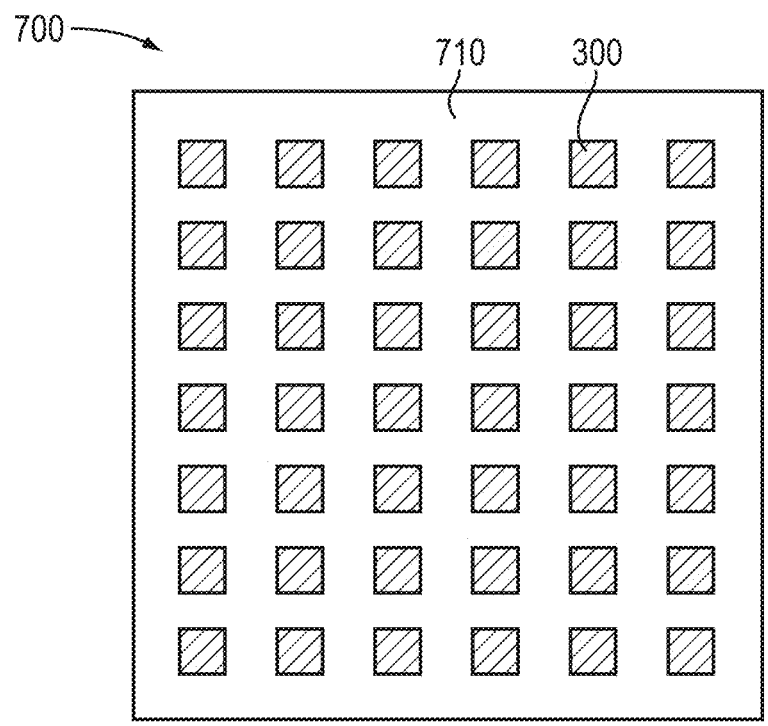
FIG. 7A is a schematic plan view of a thermal bonding layer in accordance with embodiments of the invention.
Figure 7B:
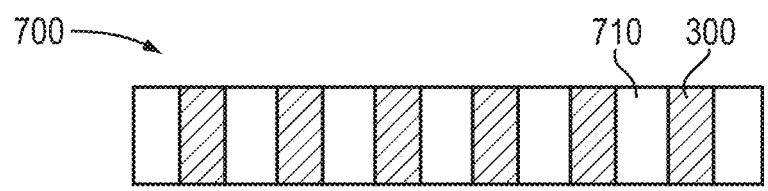
FIG. 7B is a side view of the thermal bonding layer of FIG. 7A.

FIGS. 7A and 7B depict a thermal bonding layer 700 in which multiple discrete regions or particles of thermal bonding material 300 are interspersed within another thermal bonding material 710, for example, a thermally conductive solder, foil, liquid, paste, or gel material that includes, consists essentially of, or consists of one or more materials such as indium, lead, tin, silver, and/or a mixture or an alloy thereof or with one or more other metals. All or some of the regions of thermal bonding material 300 may be approximately cylindrical in shape, or they may have other shapes that are regular or irregular. When utilized within a laser device in accordance with embodiments of the invention, most of the clamping force forcing various components together may be applied to the regions of thermal bonding material 300 of the thermal bonding layer 700, while the thermal bonding material 710 may be disposed therebetween. In such a configuration, the thermal bonding material 700 may continue to provide thermal conductivity through the thermal bonding layer 700 while creep or other movement of the thermal bonding material 710 is minimized or substantially eliminated by the regions of thermal bonding material 300. The regions of thermal bonding material 300 may both reduce the amount of clamping force applied to the thermal bonding material 710 and provide an impediment to free flow of the thermal bonding material 710 from between the components of the laser device. The regions of thermal bonding material 300 may have an average size (e.g., average diameter or width or other dimension such as height) less than or substantially equal to the thickness of the thermal bonding layer 700. The average size may be at least one-half of the thickness of the thermal bonding layer 700. For example, the regions of thermal bonding material 300 may span substantially the entire distance between the components between which the thermal bonding layer 700 is disposed, and at least some of the regions of thermal bonding material 300 may be in contact with both such components.

Figure 8:
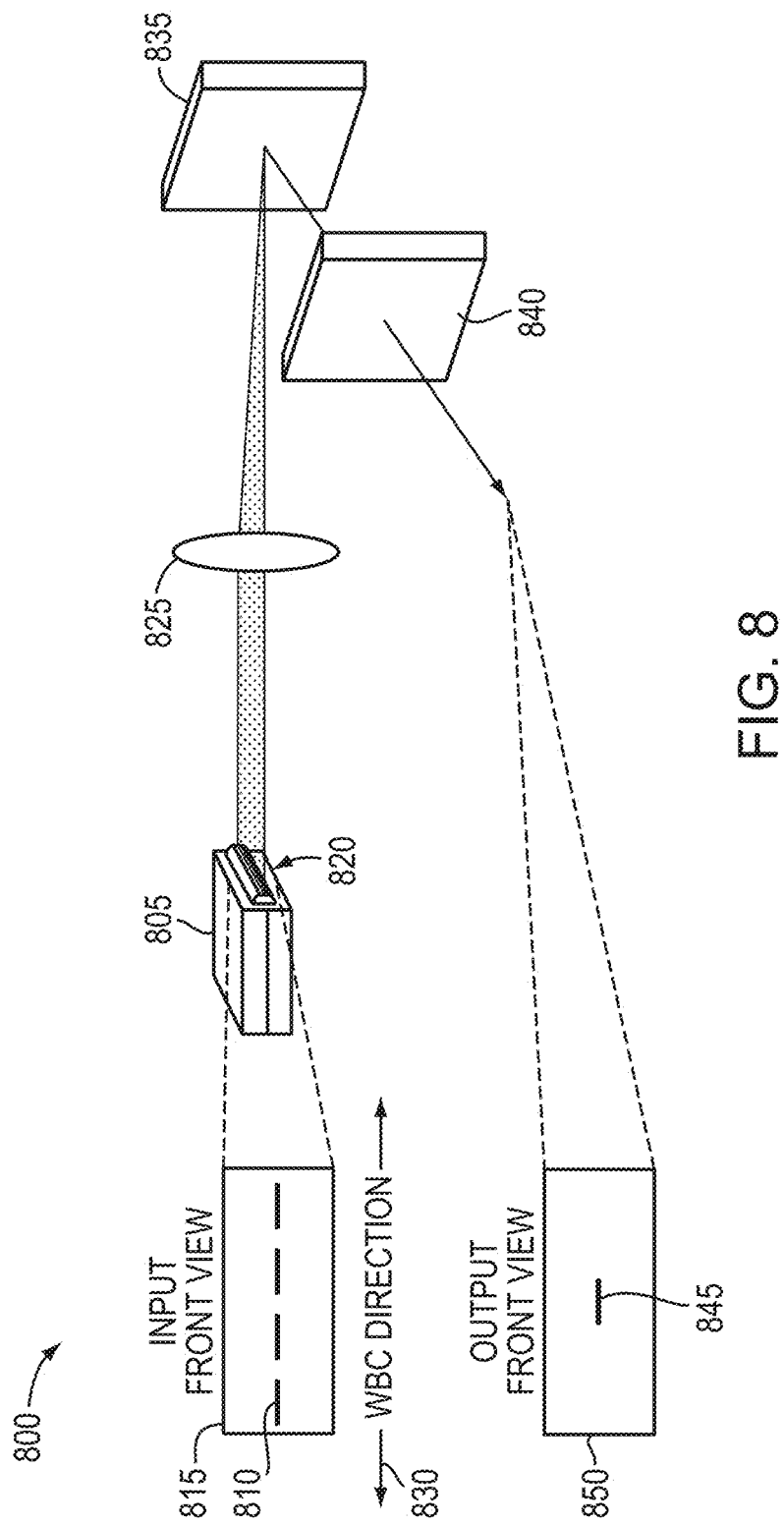
FIG. 8 is a schematic view of a wavelength beam combining laser system incorporating a packaged laser in accordance with embodiments of the invention.

Packaged lasers in accordance with embodiments of the present invention may be utilized in WBC laser systems. FIG. 8 depicts an exemplary WBC laser system 800 that utilizes a packaged laser 805. The packaged laser 805 may incorporate, for example, one or more thermal bonding layers or materials 300, 700, and may even incorporate a sealing material 500 as detailed herein. In the example of FIG. 8, laser 805 features a diode bar having four beam emitters emitting beams 810 (see magnified input view 815), but embodiments of the invention may utilize diode bars emitting any number of individual beams or two-dimensional arrays or stacks of diodes or diode bars. In view 815, each beam 810 is indicated by a line, where the length or longer dimension of the line represents the slow diverging dimension of the beam, and the height or shorter dimension represents the fast diverging dimension. A collimation optic 820 may be used to collimate each beam 810 along the fast dimension. Transform optic(s) 825, which may include or consist essentially of one or more cylindrical or spherical lenses and/or mirrors, are used to combine each beam 810 along a WBC direction 830. The transform optics 825 then overlap the combined beam onto a dispersive element 835 (which may include or consist essentially of, e.g., a diffraction grating such as a reflective or transmissive diffraction grating), and the combined beam is then transmitted as single output profile onto an output coupler 840. The output coupler 840 then transmits the combined beams 845 as shown on the output front view 850. The output coupler 840 is typically partially reflective and acts as a common front facet for all the laser elements in this external cavity system 800. An external cavity is a lasing system where the secondary mirror is displaced at a distance away from the emission aperture or facet of each laser emitter. In some embodiments, additional optics are placed between the emission aperture or facet and the output coupler or partially reflective surface.

The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

The invention claimed is:

1. A wavelength beam combining laser system comprising:
    a beam emitter configured to simultaneously emit a plurality of discrete beams and having first and second opposed surfaces;
    focusing optics for focusing the plurality of beams onto a dispersive element;
    the dispersive element for receiving and dispersing the received focused beams;
    a partially reflective output coupler positioned to receive the dispersed beams, transmit a portion of the dispersed beams therethrough as a multi-wavelength output beam, and reflect a second portion of the dispersed beams back toward the dispersive element;
    a first electrode mount disposed proximate the first surface of the beam emitter; and
    a thermal bonding layer disposed between the beam emitter and first electrode mount, the thermal bonding layer improving thermal conduction between the beam emitter and the first electrode mount,
    wherein the thermal bonding layer comprises (i) a first layer of a first metallic bonding material, the first layer being in direct contact with the beam emitter and comprising at least one of In, Sn, AuSn, or InSn, (ii) a second layer of a second metallic bonding material being in direct contact with the first electrode mount, and (iii) disposed between and in direct contact with the first and second layers, a third layer comprising an array of carbon nanotubes embedded within a matrix material, the matrix material being in direct contact with the first and second layers and comprising at least one of In, Sn, Au, Ag, Zn, Pb, AuSn, or InSn.

2. The laser system of claim 1, wherein the dispersive element comprises a diffraction grating.

3. The laser system of claim 1, further comprising an optical fiber configured to receive the multi-wavelength output beam.

4. The laser system of claim 1, wherein the thermal bonding layer consists of the first layer, the second layer, and the third layer.

5. The laser system of claim 1, wherein the matrix material consists of at least one of In, Sn, Au, Ag, Zn, Pb, AuSn, or InSn.

6. The laser system of claim 1, wherein the matrix material consists of at least one of In, Sn, AuSn, or InSn.

7. The laser system of claim 1, wherein the second layer comprises at least one of In, Sn, AuSn, or InSn.

8. The laser system of claim 1, wherein the second layer consists of at least one of In, Sn, AuSn, or InSn.

9. The laser system of claim 1, wherein the first layer consists of at least one of In, Sn, AuSn, or InSn.

10. The laser system of claim 1, wherein at least some of the carbon nanotubes within the array of carbon nanotubes are aligned substantially perpendicular to the first surface of the beam emitter.

11. The laser system of claim 1, wherein the beam emitter comprises a diode bar.

12. The laser system of claim 1, wherein the first metallic bonding material and the second metallic bonding material comprise different materials.

13. The laser system of claim 1, wherein the third layer consists of the array of carbon nanotubes embedded within the matrix material.

14. The laser system of claim 13, wherein the matrix material consists of at least one of In, Sn, Au, Ag, Zn, Pb, AuSn, or InSn.

15. The laser system of claim 1, wherein a top surface of the thermal bonding layer contacts the beam emitter and a bottom surface of the thermal bonding layer contacts the first electrode mount, further comprising a third metallic bonding material disposed on at least a portion of a lateral surface of the thermal bonding layer that spans the top and bottom surfaces.

16. The laser system of claim 15, wherein the third metallic bonding material comprises at least one of In, Sn, AuSn, or InSn.

17. The laser system of claim 1, further comprising:
    a second electrode mount (i) disposed over and in thermal contact with the second surface of the beam emitter and (ii) electrically insulated from the first electrode mount except for any conductive path through the beam emitter; and
    a second thermal bonding layer disposed between the beam emitter and second electrode mount, the second thermal bonding layer improving thermal conduction between the beam emitter and the second electrode mount,
    wherein the second thermal bonding layer comprises (i) a second array of carbon nanotubes, (ii) a third metallic bonding material disposed between the array of second carbon nanotubes and the beam emitter, and (iii) a fourth metallic bonding material disposed between the second array of carbon nanotubes and the second electrode mount.

18. The laser system of claim 17, wherein at least one of the third metallic bonding material or the fourth metallic bonding material comprises at least one of In, Sn, AuSn, or InSn.

19. The laser system of claim 17, wherein at least some of the carbon nanotubes within the second array of carbon nanotubes are aligned substantially perpendicular to the second surface of the beam emitter.

20. The laser system of claim 17, wherein the third metallic bonding material and the fourth metallic bonding material comprise different materials.

* * * * *